US012619164B2

(12) United States Patent
Onose et al.

(10) Patent No.: US 12,619,164 B2
(45) Date of Patent: May 5, 2026

(54) METROLOGY METHOD AND APPARATUS, COMPUTER PROGRAM AND LITHOGRAPHIC SYSTEM

(71) Applicant: ASML NETHERLANDS B.V., Veldhoven (NL)

(72) Inventors: Alexandru Onose, Eindhoven (NL); Remco Dirks, Deurne (NL); Roger Hubertus Elisabeth Clementine Bosch, Mierlo (NL); Sander Silvester Adelgondus Marie Jacobs, Eindhoven (NL); Frank Jaco Buijnsters, Eindhoven (NL); Siebe Tjerk De Zwart, Valkenswaard (NL); Artur Palha Da Silva Clerigo, Eindhoven (NL); Nick Verheul, Den Bosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/639,905

(22) Filed: Apr. 18, 2024

(65) Prior Publication Data
US 2024/0385531 A1      Nov. 21, 2024

Related U.S. Application Data

(63) Continuation of application No. 17/436,947, filed as application No. PCT/EP2020/054967 on Feb. 26, 2020, now Pat. No. 11,994,806.

(30) Foreign Application Priority Data

Mar. 14, 2019   (EP) ..................................... 19162808
Jun. 5, 2019   (EP) ..................................... 19178432

(51) Int. Cl.
*G03F 7/00*      (2006.01)
*G06F 30/27*      (2020.01)

(52) U.S. Cl.
CPC ........ *G03F 7/706841* (2023.05); *G03F 7/705* (2013.01); *G03F 7/70625* (2013.01); (Continued)

(58) Field of Classification Search
None
See application file for complete search history.

(56) References Cited

U.S. PATENT DOCUMENTS 9,939,250 B2    4/2018  Pisarenco et al.
9,977,340 B2    5/2018  Aben et al.
(Continued)

FOREIGN PATENT DOCUMENTS

CN        102918464        2/2013
CN        107771271        3/2018
(Continued)

OTHER PUBLICATIONS

International Search Report and Written Opinion issued in corresponding PCT Patent Application No. PCT/EP2020/054967, dated May 18, 2020.
(Continued)

*Primary Examiner* — Leigh M Garbowski
(74) *Attorney, Agent, or Firm* — Pillsbury Winthrop Shaw Pittman, LLP

(57)      ABSTRACT

A method, computer program and associated apparatuses for metrology. The method includes determining a reconstruction recipe describing at least nominal values for use in a reconstruction of a parameterization describing a target. The method includes obtaining first measurement data relating to measurements of a plurality of targets on at least one substrate, the measurement data relating to one or more acquisition settings and performing an optimization by minimizing a cost function which minimizes differences between the first measurement data and simulated measurement data
(Continued)

based on a reconstructed parameterization for each of the plurality of targets. A constraint on the cost function is imposed based on a hierarchical prior. Also disclosed is a hybrid model method comprising obtaining a coarse model operable to provide simulated coarse data; and training a data driven model to correct the simulated coarse data so as to determine simulated data for use in reconstruction.

20 Claims, 12 Drawing Sheets

(52) U.S. Cl.
CPC .......... *G03F 7/70633* (2013.01); *G06F 30/27* (2020.01); *G03F 7/70616* (2013.01)

(56) References Cited

U.S. PATENT DOCUMENTS

| | | | | |
|---|---|---|---|---|
| 10,261,427 | B2 | 4/2019 | Zeng et al. | |
| 10,627,213 | B2 | 4/2020 | Mossavat et al. | |
| 10,733,744 | B2 * | 8/2020 | Ha | G06F 30/00 |
| 11,170,072 | B2 * | 11/2021 | Mos | G03F 7/70625 |
| 11,269,260 | B2 * | 3/2022 | Carl | G03F 7/702 |
| 11,436,496 | B2 * | 9/2022 | Shamir | G06F 18/214 |
| 2008/0018874 | A1 | 1/2008 | Dusa et al. | |
| 2011/0295555 | A1 * | 12/2011 | Meessen | G03F 7/705 |
| | | | | 702/179 |
| 2012/0123748 | A1 | 5/2012 | Aben et al. | |
| 2016/0273906 | A1 | 9/2016 | Pisarenco et al. | |
| 2016/0313653 | A1 | 10/2016 | Mink et al. | |
| 2016/0325504 | A1 | 11/2016 | Mossavat et al. | |
| 2017/0160074 | A1 | 6/2017 | Mossavat et al. | |
| 2018/0330511 | A1 | 11/2018 | Ha et al. | |
| 2020/0082041 | A1 * | 3/2020 | Albert | G06F 30/27 |
| 2022/0092240 | A1 * | 3/2022 | Chi | G06F 30/17 |

FOREIGN PATENT DOCUMENTS

| | | | | |
|---|---|---|---|---|
| DE | 102018213127 A1 * | 2/2020 | | G03F 1/84 |
| TW | I5165742 | 7/2015 | | |
| TW | 201706723 | 2/2017 | | |
| WO | 2011151121 | 12/2011 | | |
| WO | 2016177548 | 11/2016 | | |
| WO | 2017093011 | 6/2017 | | |
| WO | 2020074162 | 4/2020 | | |

OTHER PUBLICATIONS

"Accurate and Fast Training of Neutral Networks for Library Application for in-Device Metrology", Research Disclosure, No. 645011 (Nov. 29, 2017).

Taiwanese Office Action issued in corresponding Taiwanese Patent Application No. 109108129, dated Dec. 22, 2020.

Office Action issued in corresponding Chinese Patent Application No. 202080020911.4, dated Jan. 15, 2024.

Taiwanese Office Action issued in corresponding Taiwanese Patent Application No. 110126232, dated Apr. 20, 2022.

* cited by examiner

METROLOGY METHOD AND APPARATUS, COMPUTER PROGRAM AND LITHOGRAPHIC SYSTEM

This application is a continuation of U.S. patent application Ser. No. 17/436,947, filed Sep. 7, 2021, which is the U.S. national phase entry of PCT Patent Application No. PCT/EP2020/054967 which was filed on Feb. 26, 2020, which claims the benefit of priority of European Patent Application No. 19162808.0, which was filed on Mar. 14, 2019, and of European Patent Application No. 19178432.1, which was filed on Jun. 5, 2019, each of the foregoing applications is incorporated herein in its entirety by reference.

FIELD

The present description relates to methods and apparatuses for metrology usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction image or pattern from which a property of interest of the target can be determined.

In order that the radiation that impinges on to the substrate is diffracted, an object with a specific shape is printed on to the substrate and is often known as a scatterometry target or simply target. As mentioned above, it is possible to determine the actual shape of a scatterometry object using a cross-section scanning electron microscope and the like. However, this involves a large amount of time, effort and specialized apparatus and is less suited for measurements in a production environment because a separate specialized apparatus is required in line with normal apparatus in, for example, a lithographic cell.

Determination of the property of interest may be performed by various techniques: e.g., reconstruction. Reconstruction, which is defined as the inference of a given parameterization based on measured data, uses iterative solvers to find a solution to the inverse problem (e.g., intensity via reflectivity to parametrization). RCWA is a forward model (parametrization via reflectivity to intensity) that can simulate how a model responds to the light; however, it cannot be used alone to infer the backwards parametrization.

To perform such reconstructions, a profile, defining the shape of a structure being measured in terms of a number of parameters, may be used. To make the profile more robust, a reconstruction recipe describing good nominal values for parameters (representative of the data as a whole) should be chosen.

It is desirable to provide a method which can help with defining a reconstruction recipe.

SUMMARY

In a first aspect, there is provided a method of determining a reconstruction recipe describing at least nominal values for using in a reconstruction of a parameterization describing a target; comprising: obtaining first measurement data relating to measurements of a plurality of targets on at least one substrate, said measurement data relating to one or more acquisition settings; s performing an optimization by minimizing a cost function which minimizes differences between the first measurement data and simulated measurement data based on a reconstructed parameterization for each of said plurality of targets; wherein a constraint on the cost function is imposed based on a hierarchical prior.

In a second aspect, there is provided a method of constructing a hybrid model for providing simulated data for use in parameter reconstruction of a structure, the method comprising: obtaining a coarse model operable to provide simulated coarse data; and training a data driven model to correct said simulated coarse data so as to determine said simulated data.

In a third aspect, there is provided a metrology apparatus operable to perform the method of the first and/or second aspect. In a fourth aspect, there is provided provides a lithographic system comprising a metrology apparatus of the third aspect.

In an embodiment, there is provided a computer program comprising processor readable instructions which, when run on suitable processor controlled apparatus, cause the processor controlled apparatus to perform the method of the first and/or second aspect, and a computer program carrier comprising such a computer program. The processor controlled apparatus may comprise the metrology apparatus of the third aspect or the lithographic system of the fourth aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figures 1, 2:
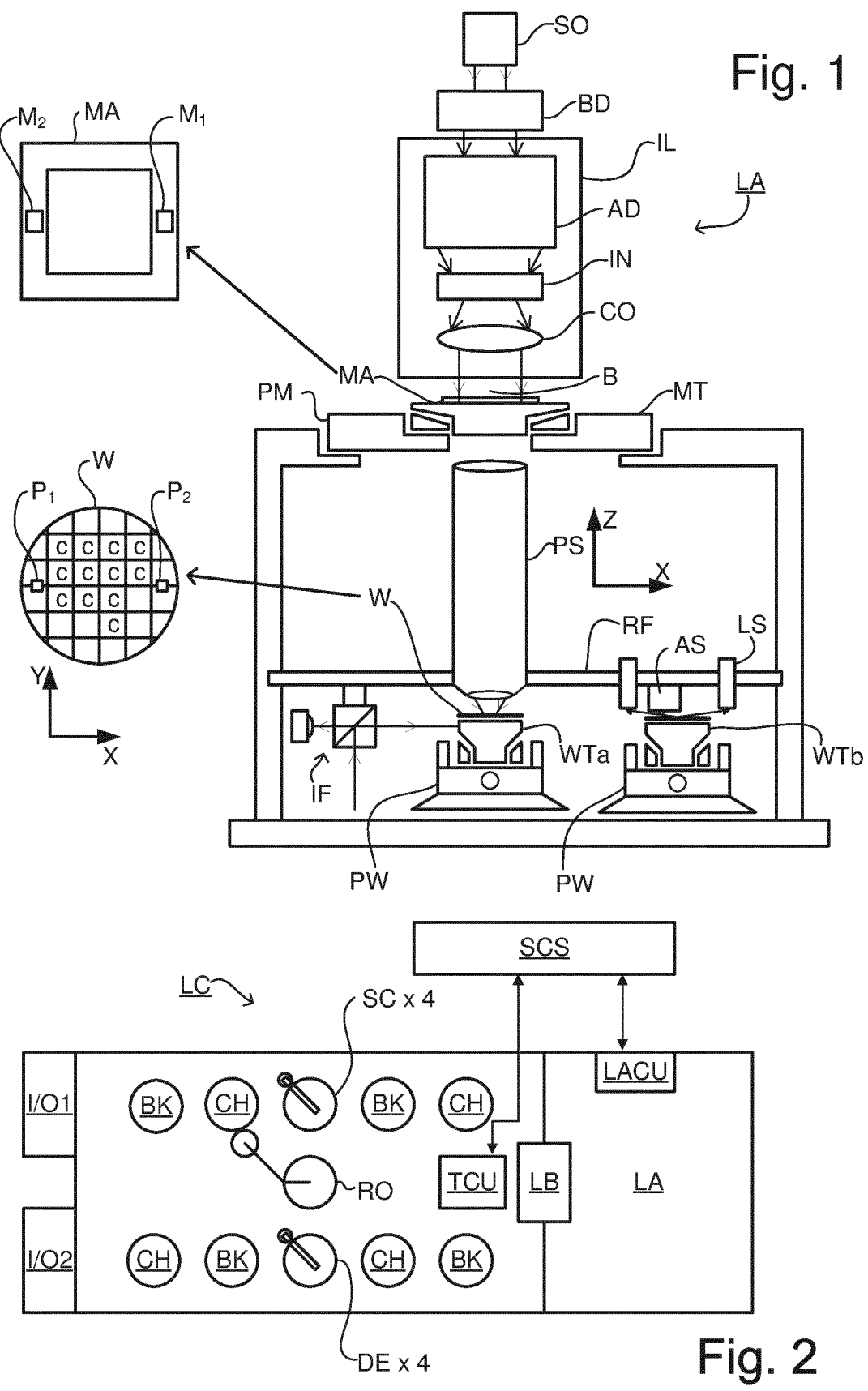
FIG. 1 depicts a lithographic apparatus.
FIG. 2 depicts a lithographic cell.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

As shown in FIG. 2, the lithographic apparatus LA forms part of a lithographic system, referred to as a lithographic cell LC or a lithocell. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
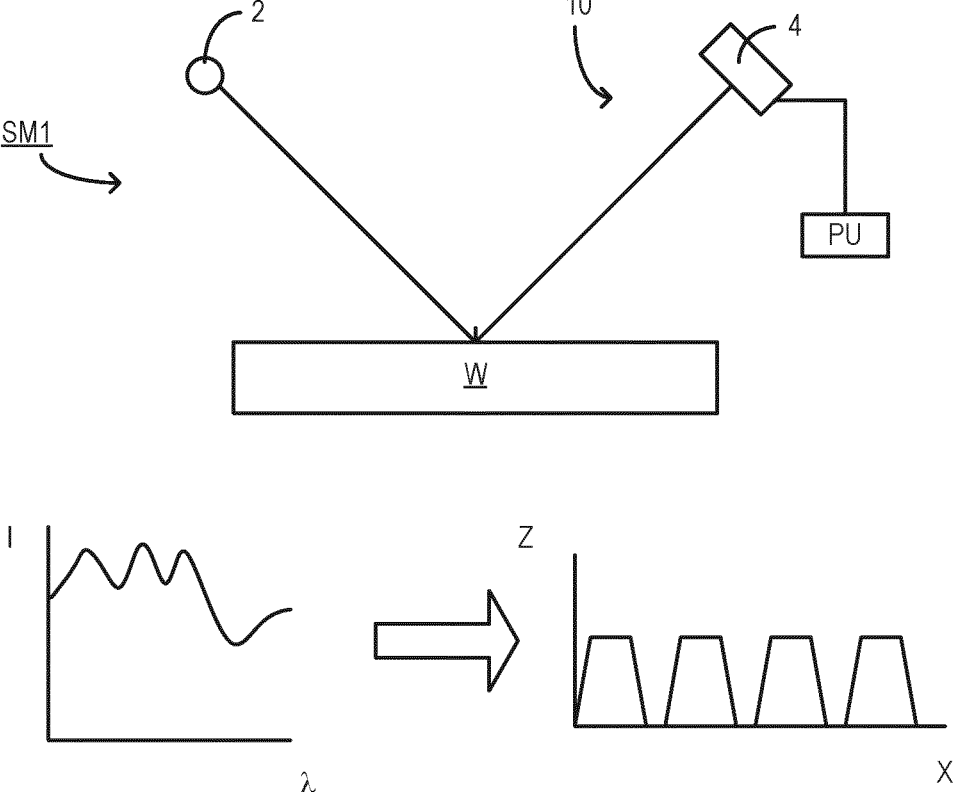
FIG. 3 depicts a first scatterometer.

FIG. 3 depicts a scatterometer which may be used. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
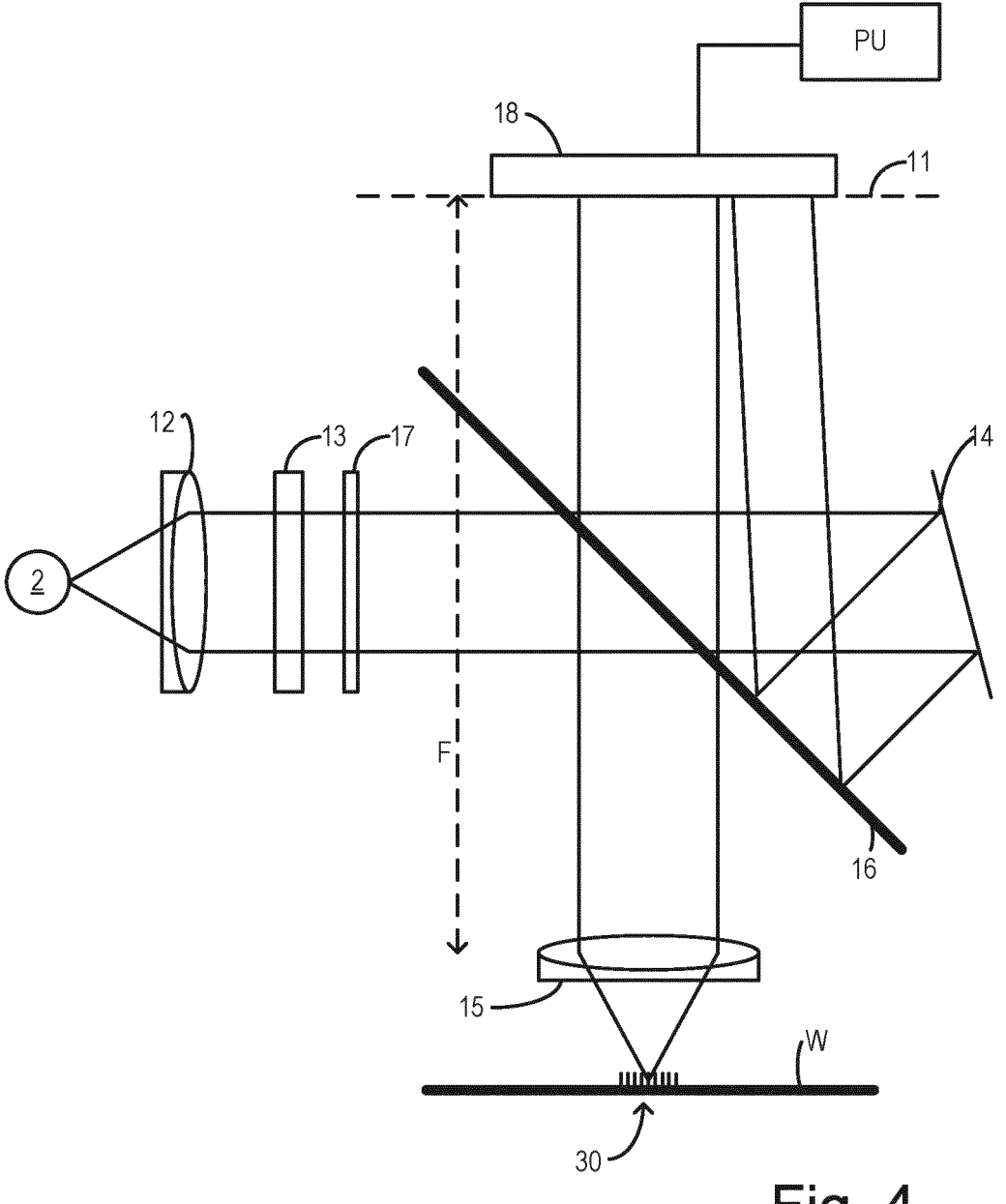
FIG. 4 depicts a second scatterometer.

Another scatterometer that may be used is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay or focus metrology. Overlay metrology is a measuring system in which the overlay of two targets is measured in order to determine whether two layers on a substrate are aligned or not. Focus metrology determines the focus (and/or dose) setting used when forming the target. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Reconstruction Based Scatterometry—Background

Using a scatterometer, such as that described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
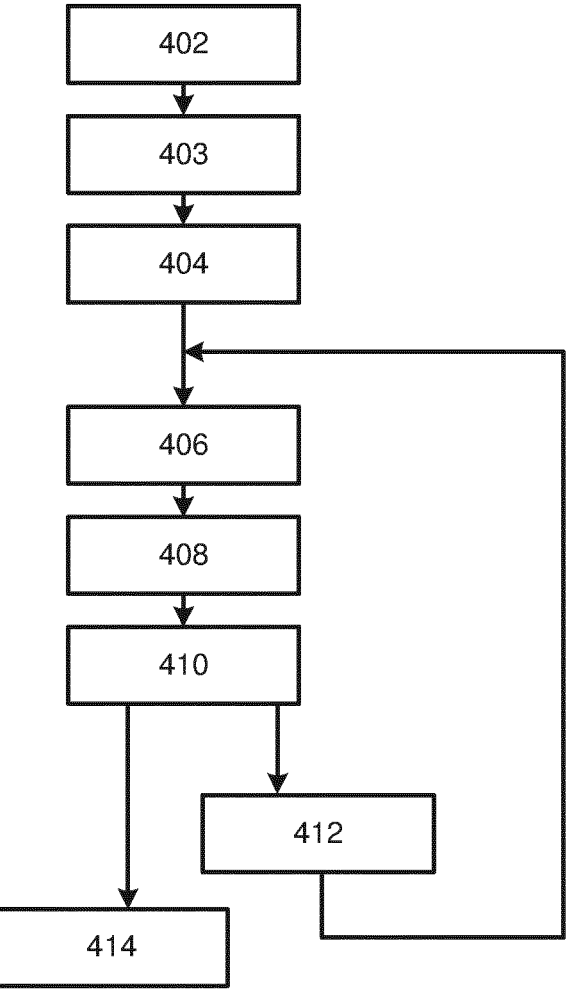
FIG. 5 is a flowchart depicting a first example process for reconstruction of a structure from scatterometer measurements.
Figure 6:
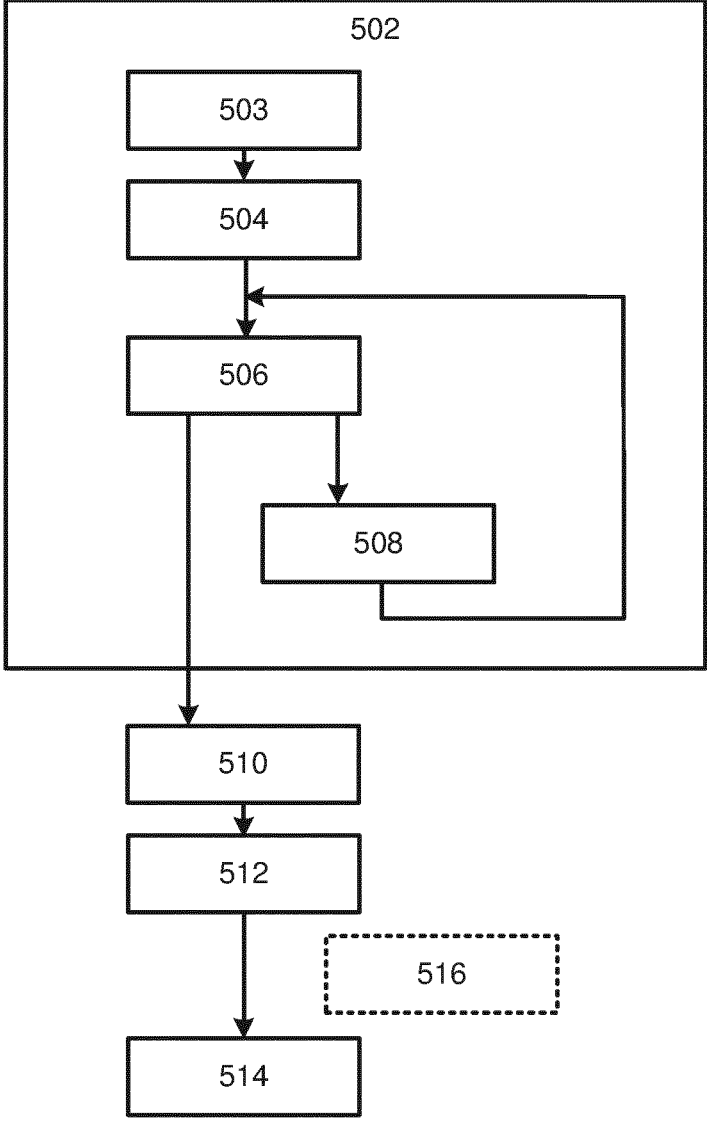
FIG. 6 is a flowchart depicting a second example process for reconstruction of a structure from scatterometer measurements.

Throughout the description of FIG. 5 and FIG. 6, the term 'diffraction image' will be used, on the assumption that the scatterometer of FIG. 3 or 4 is used. Diffraction image is an example of an inspection data element within the context of this disclosure. The skilled person can readily adapt the teaching to different types of scatterometer, or even other types of measurement instrument.

FIG. 5 is a flowchart of the steps of a method of measurement of the target shape and/or material properties, described in summary. The steps are as follows, and are then described in greater detail thereafter:

- 402—Measure Diffraction Image;
- 403—Define Model Recipe;
- 404—Estimate Shape Parameters $\theta_0$;
- 406—Calculate Model Diffraction Image;
- 408—Compare Measured v Calculated Image;
- 410—Calculate Merit Function;
- 412—Generate Revised Shape Parameters $\theta_1$;
- 414—Report Final Shape Parameters The target will be assumed for this description to be periodic in only 1 direction (1-D structure). In practice it may be periodic in 2 directions (2-dimensional structure), and the processing will be adapted accordingly.

402: The diffraction image of the actual target on the substrate is measured using a scatterometer such as those described above. This measured diffraction image is forwarded to a calculation system such as a computer. The calculation system may be the processing unit PU referred to above, or it may be a separate apparatus.

403: A profile is established which defines a parameterized model of the target structure in terms of a number of parameters $\theta$. These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the profile will define many of these to have fixed values, while others are to be variable or 'floating' parameters for the purpose of the following process steps. Moreover, ways will be introduced in which parameters can be permitted to vary without being fully independent floating parameters. For the purposes of describing FIG. 5, only the variable parameters are considered as parameters $\theta$. The profile also defines the settings of the measurement radiation for a given target structure and how to estimate the parameter values by fitting the inspection data to the model.

404: A model target shape is estimated by setting initial values $\theta_0$ for the floating parameters. Each floating parameter will be generated within certain predetermined ranges, as defined in the recipe.

406: The parameters representing the estimated shape, together with the optical properties of the different elements of the model, are used to calculate the scattering properties, for example using a rigorous optical diffraction method such as RCWA or any other solver of Maxwell equations. This gives an estimated or model diffraction image of the estimated target shape.

408, 410: The measured diffraction image and the model diffraction image are then compared and their similarities and differences are used to calculate a "merit function" for the model target shape.

412: Assuming that the merit function indicates that the model needs to be improved before it represents accurately the actual target shape, new parameters $\theta_1$, etc. are estimated and fed back iteratively into step 406. Steps 406-412 are repeated.

In order to assist the search, the calculations in step 406 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

414: When the merit function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction image using a rigorous optical diffraction theory from the estimated target structure. If more parameters are required, then there are more degrees of freedom. The estimated or model diffraction image calculated at 406 can be expressed in various forms. Comparisons are simplified if the calculated image is expressed in the same form (e.g., spectrum, pupil image) as the measured image generated in step 402.

FIG. 6 is a flowchart of the steps of an alternative method of measurement of the target shape and/or material properties, described in summary. In this method, a plurality of model diffraction images for different estimated target shapes (candidate structures) are calculated in advance and stored in a library for comparison with a real measurement. The underlying principles and terminology are the same as for the process of FIG. 5. The steps are as follows, and are then described in greater detail thereafter:

- 502—Generate Library;
- 503—Define Model Recipe;
- 504—Sample Shape Parameters $\theta_0$, . . . ;
- 506—Calculate and Store Model Diffraction Image;
- 508—New Sample Shape Parameters $\theta_1$;
- 510—Measure Diffraction Image;
- 512—Compare Measured Image v Library Images;
- 514—Report Final Shape Parameters;
- 516—Refine Shape Parameters.

502: The process of generating the library begins. A separate library may be generated for each type of target structure. The library may be generated by a user of the measurement apparatus according to need, or may be pre-generated by a supplier of the apparatus.

503: A profile is established which defines a parameterized model of the target structure in terms of a number of parameters $\theta$. Considerations are similar to those in step 503 of the iterative process.

504: A first set of parameters $\theta_0$, etc. is generated, for example by generating random values of all the parameters, each within its expected range of values.

506: A model diffraction image is calculated and stored in a library, representing the diffraction image expected from a target shape represented by the parameters.

508: A new set of shape parameters $\theta_1$, etc. is generated. Steps 506-508 are repeated tens, hundreds or even thousands of times, until the library which comprises all the stored modeled diffraction images is judged sufficiently complete. Each stored image represents a sample point in the multi-dimensional parameter space. The samples in the library should populate the sample space with a sufficient density that any real diffraction image will be sufficiently closely represented.

510: After the library is generated (though it could be before), the real target 30 is placed in the scatterometer and its diffraction image is measured.

512: The measured image is compared with the modeled images stored in the library to find the best matching image.

The comparison may be made with every sample in the library, or a more systematic searching strategy may be employed, to reduce computational burden.

514: If a match is found then the estimated target shape used to generate the matching library image can be determined to be the approximate object structure. The shape parameters corresponding to the matching sample are output as the measured shape parameters. The matching process may be performed directly on the model diffraction signals, or it may be performed on substitute models which are optimized for fast evaluation.

516: Optionally, the nearest matching sample is used as a starting point, and a refinement process is used to obtain the final parameters for reporting. This refinement process may comprise an iterative process very similar to that shown in FIG. 5, for example.

Whether refining step 516 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction images and associated refined parameter sets as new entries in the library. In this way, a library can be used initially which is based on a relatively small amount of computational effort, but which builds into a larger library using the computational effort of the refining step 516. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 406 and 506, i.e. the calculation of the estimated model diffraction image using a rigorous optical diffraction theory from the estimated target structure shape.

The creation of a profile involves multiple refinements of the profile, wherein the physical model is gradually adjusted to best represent the inspection data. The inspection data may comprise inspection data elements. The inspection data elements may be images, diffraction images (if diffraction based scatterometery is being used), spectra or pupil images; or else may be reconstructed parameter values obtained from such diffraction images etc. Each of the inspection data elements may be obtained by inspection of a corresponding target structure, e.g., using a scatterometer such as those described above. Each of these inspection data elements may be described by a plurality of intensity values. The adjustments are typically based upon the results of reconstructions. Reconstructions, as described, fit the model to the inspection data, thereby transforming the inspection data elements into parameter values. At the beginning of the procedure, reconstructions may fail as uncertainties may be large. It may therefore be more effective to reconstruct only one or a few measurements rather than the complete set of data.

To make a profile more robust, the nominal parameter values for the profile should be well chosen. Ideally, to properly estimate these nominal parameter values, many target structures should be reconstructed.

From first measurement data; e.g., measurements of the intensity $I_m$ of the scattered light, the parameter inference is typically approached in two different ways:

Inverse model based inference: The stack structure, parametrized with stack parameters $\theta$, is modeled through electro-magnetic (EM) simulation and its response matched with the measured intensity data $I_m$. In this approach only the direct mapping from parameters $\theta$ to measured intensities $I_m$ is known. The solution may be found by solving an optimization task comprising a data term and prior knowledge encoded in a cost function. In a simplified view, the inference iteratively maps $\theta$ to intensity $I(\theta)$ until $I(\theta) \approx I_m$.

Typically, the optimization task has a general form of:

$$\arg\min_{\theta} \|V(I_m - I(\theta))\|_2^2 + f(\theta) \qquad \text{(Equation 1)}$$

where $f(\theta)$ is a generic prior (e.g., L2 norm) which encodes the prior information that the targets should belong to the same process/process window, for example: $f(\theta) =$ $$\|W(\theta - \theta^*)\|_2^2,$$

where $\theta^*$ describes a nominal parameterization. Here V and W are (e.g., diagonal) scaling matrices. It should be appreciated that both diagonal and full scaling matrices are possible.

Data driven inference: An empirical, approximate direct mapping constructed using prior assumptions and experimental data. The prior assumptions may include, for example, linearity with respect to a parameter, preprocessing to transform the measured intensities into a simpler to use form (e.g., such as using symmetry or anti-symmetry). The mapping can then be used for direct prediction. In a simplified view, the inference maps from $I_m$ to $\theta$.

A third, hybrid approach, that combines data driven and model based solution, is additionally disclosed herein (below).

For the hybrid or conventional model based inference methods, the current way of working involves the creation of a profile using stack information and the build-up of a recipe according to a recipe creation flow. The end goal is to have a recipe that meets specifications in terms of goodness of fit and matching (between tools, with a tool of reference).

Hierarchical and Data Driven Recipe Creation

The current approach for the creation and validation of a model based inference recipe comprises a large number of steps which may be referred to as a recipe creation flow (RCF). The creation of the recipe involves the use of number of tools in a feed-forward manner, without any feedback, so as to meet desired key performance indicators (KPIs); e.g. in terms fingerprint matching (FPM). Such a flow can be broken down into three stand-alone (non-communicating) blocks: material properties optimization, profile validation and profile optimization.

Recipe creation can be very labor intensive, due to lack of automation and the need of super-user input throughout the whole process. User experience is required to arrive at a profile which meets the accuracy/matching requirements. Typically the recipe creation flow comprises arbitrary tweaks of parameters (e.g. fix/float, nominal) which make reproducing the creation flow impossible.

To improve on recipe creation flows as described above, an automated, optimization driven, solution will now be described. Such an approach can produce a valid recipe with minimum user interaction. The main concept comprises performing a reconstruction which combines all or a large number of possible information channels (e.g., multiple targets and multiple wavelengths), and which includes observations by other metrology tools, so to provide all the statistics (mean, variation, fix/float) required to setup a recipe.

The proposed method comprises the use of a hierarchical prior coupled with a data driven prior in the cost function, which link together measurements from a large number of targets, through multiple wavelengths. The data driven prior information can be obtained from any suitable metrology data available (e.g., CD-SEM data, ellipsometry data for material properties) and ensures that the recipe is matched with that tool (i.e., the tool of reference). It also adds more information for the inference and helps with the parameter correlation. The resulting large scale optimization task couples, automates and improves upon the manual steps of present recipe control flow methods.

Equation 2 is an example of a hierarchical and data driven cost function which can form the basis of the proposed approach. The proposed approach can be viewed multi-layered inference task, stated as a large optimization task:

$$
\underset{\theta_t, \theta^*, \theta_\lambda^*, c^{(k)}, s^{(k)}}{\operatorname{argmin}} \sum_{t=1, \lambda=1}^{n,m} \|V(I_{t,\lambda} - I(\theta_t, \theta_{t,\lambda}))\|_2^2 + 
$$
(Equation 2)

$$
\alpha_{\ell_1} \sum_{t=1, \lambda=1}^{n,m} \left( \|Q(\theta_t - \theta^*)\|_1^1 + \|S(\theta_{t,\lambda} - \theta_\lambda^*)\|_1^1 \right)
$$

$$
\text{s.t.} \left\| \begin{matrix} \theta_1^{(k)} - s^{(k)}\overline{\theta}_1^{(k)} + c^{(k)} \\ \vdots \\ \theta_n^{(k)} - s^{(k)}\overline{\theta}_n^{(k)} + c^{(k)} \end{matrix} \right\|_p^p \leq \epsilon^p,
$$

$$
\forall k \ \theta_t^{(j)} = \theta_t^{(j)}, \forall j \in \mathcal{J}, \forall t \in \mathcal{T} \ \check{\theta}_t^{(j)} \leq \theta_t^{(j)} \leq \hat{\theta}_t^{(j)}.
$$

Equation 2 comprises a data fidelity term which combines measurements of multiple targets t taken with multiple wavelengths A. The (e.g. diagonal or full) scaling matrix V, scales the data fidelity term so as to encode the statistical assumption of the variance for (e.g., Gaussian) noise affecting the measured data. Other noise distributions can be encoded if a norm other than an L2 norm is used. Here it is assumed that the machine is properly calibrated and that the remaining residual flows a normal distribution. The aim in solving the cost function is to recover the parametrization $\theta_t$, $\theta_{t,\lambda}$ of each target which minimizes the difference between the measured intensities $I_{t,\lambda}$ and calculated intensities $I(\theta_t, \theta_{t,\lambda})$ based on a certain parametrization $\theta_t$, $\theta_{t,\lambda}$ of each target t; where $\theta_t$ are wavelength (or, more generally, acquisition setting and target) independent parameters and $\theta_{t,\lambda}$ are wavelength and target dependent parameters.

The other term is the prior term, which sets the fix-float and nominal parameterization $\theta^*$, $\theta_\lambda^*$ (the $\lambda$ subscript again distinguishing the wavelength-dependent parameters), where $\alpha_{\ell_1}$ sets the regularization strength. The diagonal scaling matrices Q and S encode the prior information regarding the scale of the parameters, e.g. assuming a sidewall angle with a physical variation of 2-3 degrees and a height with a variation of 200 nm, the regularization should penalize both with the same relative strength.

The fix-float is imposed with respect to a data driven nominal parametrization. This is performed to reduce the dimensionality of the problem, for faster online evaluation and to stabilize the solution by structurally breaking parameter correlations. The $\ell_1$ norm promotes solution sparsity with respect to the nominal value $\theta^*$, $\theta_\lambda^*$.

Equation 2 provides for automatic matching with respect to the tool of reference, by constraining parameters for which experimental data is available so as to follow the same trend across the targets. The slope term $s^{(k)}$ and offset term $c^{(k)}$ link each parameter term $\theta_t^{(k)}$ for a particular profile parametrization of the target on the wafer to an equivalent parameter term $\overline{\theta}_1^{(k)}$ for the tool of reference (i.e., from the experimental prior data $DAT_{exp}$). These terms can be used to ensure cases when the tool of reference "sees" the target differently to the present tool are similarly treated (e.g., where the tool of reference measures top-cd while the present parametrization is with respect to mid-cd).

Statistical errors that affect the measured data are accounted for by allowing an inexact match, the solution being constrained to an $\ell_p$-ball of size $\epsilon^p$, with p resulting from error distribution (e.g., the statistical distribution of the errors made by the tool of reference). Typically a normal distribution is assumed for the errors, resulting in an $\ell_2$-ball. More complicated error statistics can be incorporated, provided that the constraints remain convex.

Min-max constraints $\check{\theta}_t^{(j)} \leq \theta_t^{(j)} \leq \hat{\theta}_t^{(j)}$ are imposed to constrain for the region of interest. The range of the stack parameters are constrained to remain within a valid physical parametrization. Cross target consistency can be imposed for highly correlated parameters $\theta_t^{(j)}$, $j \in \mathcal{J}$, such as for material properties (as opposed to geometrical properties). In this way, multiple targets $t \in \mathcal{T}$ can be grouped with the assumption that they have the same parameter value, e.g., while unknown, the silicon properties across a particular wafer are constant, and therefore the targets can be grouped and constrained in this manner per wafer.

The solution to Equation 2 involves an iterative algorithmic solution and the priors are (chosen to be) convex to ensure algorithmic tractability. One possible solution is to employ an approximate splitting algorithm, for example an appropriate variable metric preconditioned proximal splitting algorithm, which splits the data fidelity term from the remaining terms. A variable-metric methods, quasi-Newton step is performed on the data fidelity term. The resulting proximal step with respect to the remaining terms, although compound and non-trivial, produces a convex cost function and the solution to it can be found sub-iteratively, for example by the use of a proximal splitting, primal dual solver.

Figure 7:
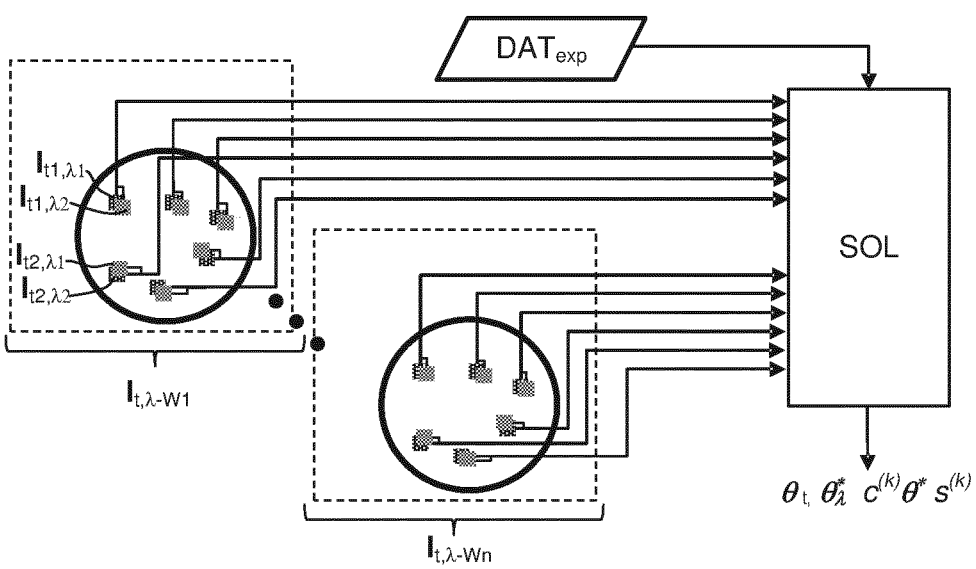
FIG. 7 depicts the input data for a hierarchical solver according to an embodiment of the invention.

FIG. 7 is a schematic view of the data used for the recipe creation. Shown here are sets of measurement data $I_{t,\lambda-W1}$ . . . $I_{t,\lambda-Wn}$ from N wafers (W1-Wn), relating to multiple targets t (six targets are shown t1-t6—only t1 and t2 are labelled for clarity) having been captured with several acquisition settings or wavelengths (two wavelengths are shown $\lambda 1$, $\lambda 2$). Different acquisition settings may include different polarization settings, wafer rotations, phase retarder rotations in addition to wavelength (varied separately or in different combinations). Where wavelength is used as an example in most of the description, it should be understood that it can always be generalized to acquisition setting.

This measurement data, along with the experimental prior data $DAT_{exp}$ (tool of reference data such as e.g., CD-SEM data), is fed to a hierarchical optimization solver SOL which solves Equation (2). The output of optimization solver SOL comprises per-target solutions $\theta_t$, $\theta_{t,\lambda}$, nominal $\theta^*$, $\theta_\lambda^*$, and the offset term $c^{(k)}$ and slope difference $s^{(k)}$ with respect to the tool of reference. The concept is applicable for any number of wafers/wavelengths including only a single wavelength and/or a single wafer. Note that Equation 2 is extensible with any suitable additional convex term.

Main Information Flow for Recipe Creation

Figure 8:
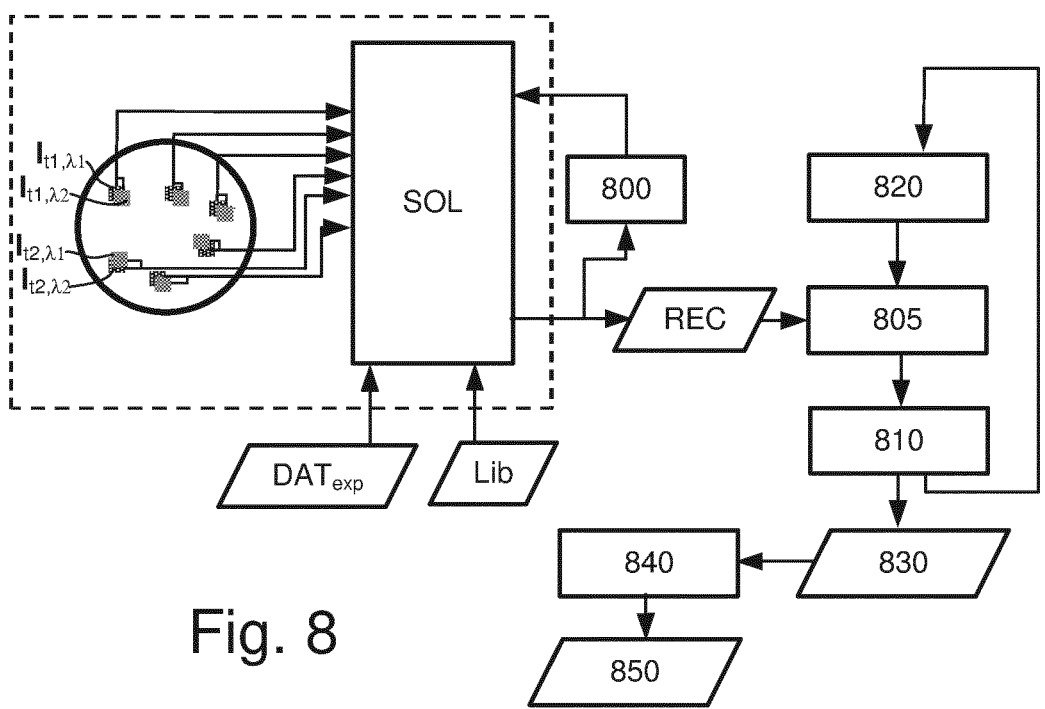
FIG. 8 is a flowchart depicting a method of according to an embodiment of the invention.

FIG. 8 illustrates a method flow for recipe creation. It is proposed to solve the hierarchical problem described by Equation 2 wherein the regularization strength of (first) regularization term $\alpha_{\ell_1}$ is varied 800 between each solution, such that the hierarchical problem is solved for multiple regularization strengths $\alpha_{\ell_1}$. The hierarchical solver SOL output is then used as a recipe for a single target reconstruction, for example a nonlinear least squares (NLSQ) single target reconstruction. The regularization prior for the NLSQ reconstruction is iteratively configured such that the solution statistics (mean, variance and/or covariance) between the two solvers (hierarchical solver SOL and single target reconstruction 805) are matched across the measurements used.

The hierarchical solver SOL receives the measured intensities $I_{t,\lambda}$, experimental prior data $DAT_{exp}$ and (e.g., to speed up calculation time) library data Lib. The solution of the proposed optimization task described by Equation 2 will generate the following information to be transferred as a recipe REC for a single target reconstruction, for example a single/double wavelength, nonlinear, least squares based online inference framework:

a nominal value $\theta^*$, $\theta_\lambda^*$ which is the starting point of the search for the inverse problem solution and also serves a regularization point. This defines the centroid of the lithography process window.

a strategy to fix insensitive or constant parameters across the recipe creation training dataset/datasets. Such fix/float strategy results dynamically from the optimization task and is valid within the process window.

a multi-target reconstruction $\theta_t$, $\theta_{t,\lambda}$ that matches the parameters of interest with third party measurements (via offset term c (k) and slope difference s (k)), within confidence regions of those measurements. Based on this solution, a regularization strategy is defined for the single target reconstructions such that the reconstructions without the hierarchical/data driven priors produce the same inferred parameter distribution.

The recipe REC output from hierarchical solver SOL is then used in a single target reconstruction 805 e.g., by a NLSQ solver. The statistical properties of the outputs of the two solvers are compared 810, and if not yet matched (sufficiently), the regularization strength is updated 820 and both solvers run again. When matched, the parameter of interest values 830 are returned. These are checked against relevant KPIs (e.g., FPM) 840, and the recipe with best KPIs is reported 850.

The parameter ranges can be reduced around the found nominal to the extent that they cover the solver path for the single target reconstruction using NLSQ. The solver trajectories can be evaluated experimentally by performing reconstructions for multiple wafers.

The choice to fix some parameters to the nominal values and to search for the solution on the resulting manifold is implicitly generated by the $\ell_1$-norm prior from Equation 2. The prior tries to explain the data with the least number of parameters changed with respect to the nominal value. The exact fix-float strategy requires the post processing of the solution, to identify the parameters that do not vary significantly from the nominal.

The meta-problem can be defined as the matching the statistical properties (mean and/or variance) of the solution from the two solvers (NLSQ and the hierarchical solver). The choice of scaling of the regularization term in Equation 1 can be determined via an iterative solution. Equation 1 can be rewritten as:

$$\arg\min_\theta \|V(I_m - I(\theta))\|_2^2 + \alpha_{\ell_2}\|H(\theta - \theta^*)\|_2^2 \qquad \text{(Equation 3)}$$

Thus, $\alpha_{\ell_2}$ can be viewed as a second regularization term and H as the direction dependent scaling of the regularization. To match the solution distribution, the appropriate values for $\alpha_{\ell_2}$ and H should be found. H may be a diagonal or full scaling. One option for H, for example, is the matrix square root of the inverse of the variance or covariance matrix of the hierarchical solution.

This results in the minimization of the Kullback-Leibler divergence, $D_{KL}(\mathcal{H} \| \mathcal{S})$, between the parameter distribution $\mathcal{H}$ from the hierarchical solver and the single targets solution distribution $\mathcal{S}$ resulting from solving Equation 3 for multiple targets. This can be stated as the non-convex optimization problem:

$$\arg\min_{\alpha_{\ell_2},H} D_{KL}(\mathcal{H} \| \mathcal{S}) \qquad \text{(Equation 4)}$$

which involves solving multiple optimization sub-problems as defined by Equation 3 for all targets to produce the statistics $\mathcal{S}$.

Figure 9:
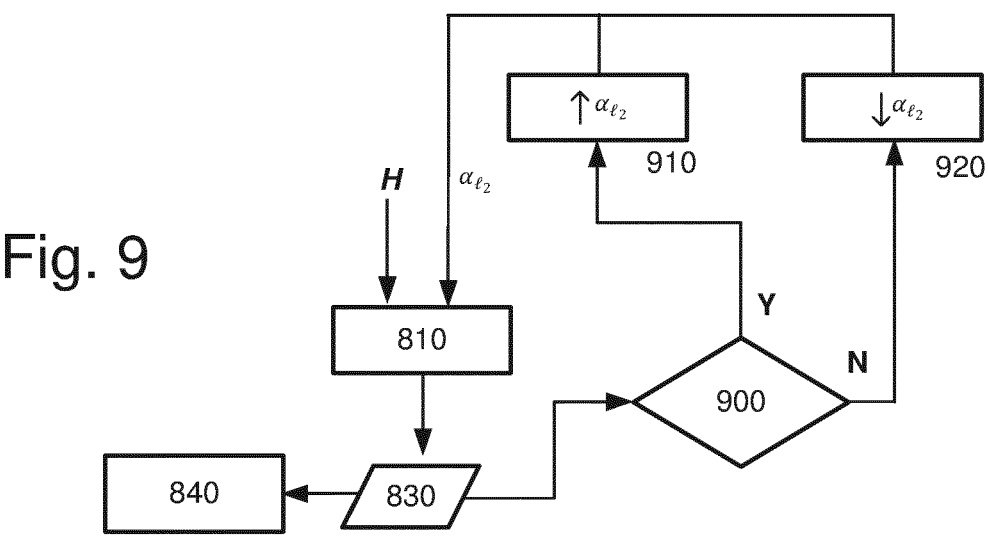
FIG. 9 is a flowchart depicting the matching of the single target reconstruction to the hierarchical solver.

A simpler heuristic approach to tackle it can be devised, as illustrated by the flow of FIG. 9. A first choice for H can be set as is the matrix square root of the inverse of the variance or covariance matrix. To find $\alpha_{\ell_2}$ it is determined at step 900 whether the combined parameter variation (of the parameter of interest values 830 output from solver 810) is larger than that of the hierarchical optimization solution. If yes, $\alpha_{\ell_2}$ is increased 910; otherwise $\alpha_{\ell_2}$ is decreased 920. This loop is repeated n times (where n is the total number of targets). Setting individual values in H can potentially improve the solution, however it would make the heuristic solution more involved.

Therefore a recipe creation flow comprising a hierarchical optimization task is disclosed. The method comprises multiple measurements spanning multiple targets over (optionally) multiple wafers. The recipe creation flow further couples tool of reference data directly into the recipe creation flow. It provides for a data driven search for the fix-float strategy, ranges and nominal, directly in the optimization problem. Also described is a recipe transfer from the hierarchical solver to the single target NLSQ solver with statistical property matching between the solutions. An alternative criterion, essentially minimizing the error with respect to the tool of reference values, also produces good results.

As such, the described approach automates the whole RCF flow and removes the extensive human interaction. It provides a constructive and reproducible approach to recipe creation that is constrained towards the matching to the tool of reference and allows for an automated recipe transfer between recipe creation stage and single target/on-tool inference.

Hybrid Inference System

It has already been described that reconstruction tends to fall into two categories data driven methods and model based inference methods. However, both of these methods have inherent drawbacks. Data driven methods lack robustness as they rely on limited training data which is costly to obtain and is produced with significant systematic and random errors. Pure data driven methods can only work reliably in the same process window as that in which they were trained. If the process drifts or changes the inference model (recipe) needs to be adapted. Experimental wafers need to be generally produced and measured. Current approaches for model based inference is complex and information heavy, comprising very computationally demanding and complex EM simulations. They require the construction of libraries to create surrogate models for the targets EM response. The model needs to be accurate and therefore requires extensive customer (sensitive) information. Model errors will have a significant impact on the inference.

To address this, a hybrid inference system is proposed which bridges the gap between model based and data driven inference. The proposed method begins with a coarse model and refines the model in a data driven approach. It can rely on optional auxiliary information, such as measurements performed by other tools (e.g. CD-SEM data) which can be coupled with the scatterometry measurements.

Figure 10:
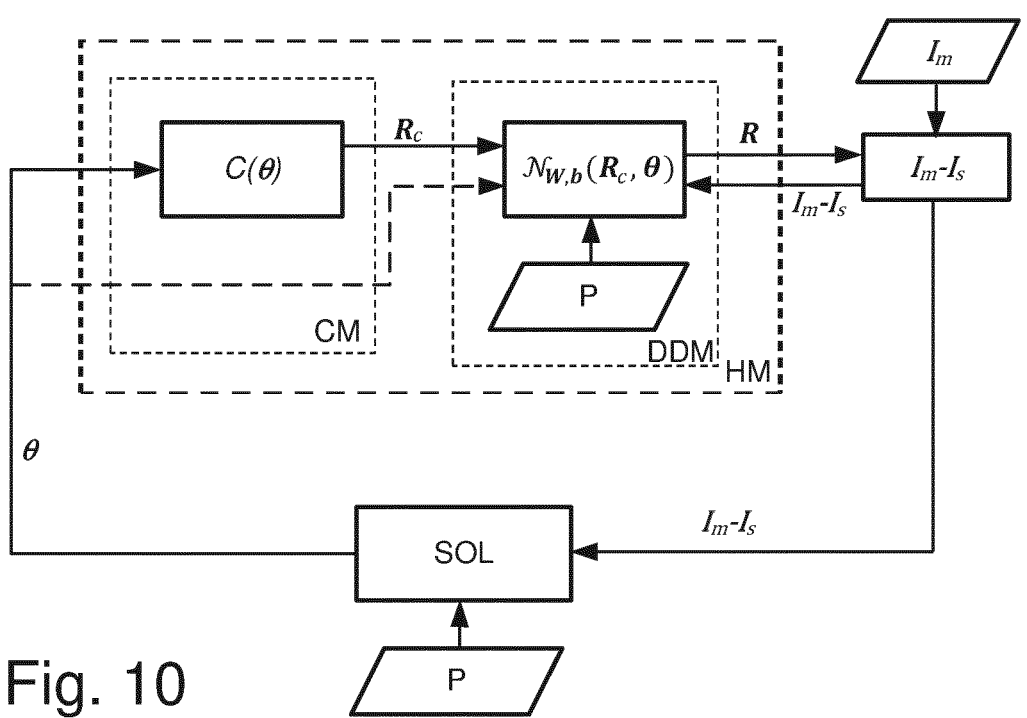
FIG. 10 is a flow diagram describing the training of a hybrid model according to an embodiment of the invention.

FIG. 10 is a high level schematic of the proposed method. A hybrid model HM comprises a fixed coarse model CM and a data driven model DDM, the latter needing to be trained. $\theta$ denotes the stack parametrization, where estimates $\theta_e$ represent values for the parameters for which the simulated intensity $I_s$ fit the measured intensities $I_m$ to a given degree at a training iteration. $R_C$ denotes the coarse reflectivities as produced by the coarse model CM, R denotes the reflectivities as produced by the data driven model DDM. Mapping from reflectivity space R to simulated intensities $I_s$, i.e., the calibration model, is denoted by $I_s = \jmath$ (R).

The training of the data driven model DDM and the search for the inverse problem solution SOL together minimizes the difference between a measured intensity $I_m$ and a simulated intensity $I_s$, (optionally with additional priors). The goal is to jointly find the model correction $\mathcal{N}_{W,b}$ and the solution parametrization $\theta$ (where $\theta$ is a generic parametrization, and $\theta_{e_i}$ is the parametrization for a specific target i).

The coarse model CM of the stack can be constructed in a manner similar to current stack reconstruction, but allowing for a high degree of inaccuracy. This may comprise not using exact material properties, precise ranges or nominal values for the stack parameters in determining the coarse model. It is considered fixed during the hybrid inference. In principle small model errors (missing insensitive layers, inaccurate parametrization of insensitive regions of the stack) can also be tolerated. The coarse model can be approximated accurately and fast using the progressive library functionality. For example, the library creates a surrogate model that can map between the parametrization, WL and angle of incidence/pixel location to the reflectivities of the stack. It is built by evaluating the stack response in a large number of configurations, for individual pixels (not full pupils). A neural network model is trained to learn the mapping. The coarse model can be viewed as a coarse profile for which a library is constructed. A data driven model DDM is appended on top of the coarse model to correct the coarse reflectivities $R_c$ such that the measured intensities are matched, while also finding the appropriate parametrization $\theta$.

The training of the hybrid model HM is an iterative process based on measurements of a large number N of targets. It can also use any auxiliary information available, e.g. CD-SEM data for a subset of the targets, as priors P. The data driven model DDM is defined by a neural network $\mathcal{N}_{W,b}$ or other machine learning model. Initially $\mathcal{N}_{W,b}$ represents the identity mapping, i.e. R=R$_c$.

A training example will now be described which is composed of two steps that are repeated until convergence:

The first step comprises solving SOL the inverse problem associated with the model parameter inference for all N available measurements, for all wavelengths (if multiple wavelength measurements are used) which make up the measured intensity data $I_m$. It is assumed that the coarse EM model CM exists and a library is built for it. Prior information P can be imposed based on measurements for some of the parameters (e.g. CD-SEM data) defined generically by f ($\theta_e$).

At the second step, the resulting solutions $\theta_e$ are used to update the model of the neural network $\mathcal{N}_{W,b}$ such that the measured intensities $I_m$ are a better fit to the model output (i.e., the simulated intensities $I_s$ corresponding to reflectivities R). The function g(W,b) represents a generic regularization. The training should be well regularized to avoid overfitting. In this regard, it can be assumed that the coarse reflectivities $R_c$ are reasonably accurate and, as such, it can be imposed that the accurate reflectivities R remain reasonably close to the coarse reflectivities $R_c$. For example this can be imposed through $$g(W, b, R, R_c) = \kappa \|R_c - R\|_2^2,$$

where $\kappa$ represents the strength of this assumption.

Iterating according to the scheme (i.e., in accordance with Algorithm 1 below) produces solutions which converge in terms of both the estimates $\theta_{e_i}$ and of the model correction $\mathcal{N}_{W,b}$ defined by the neural network weights and biases W, b.

Figure 12:
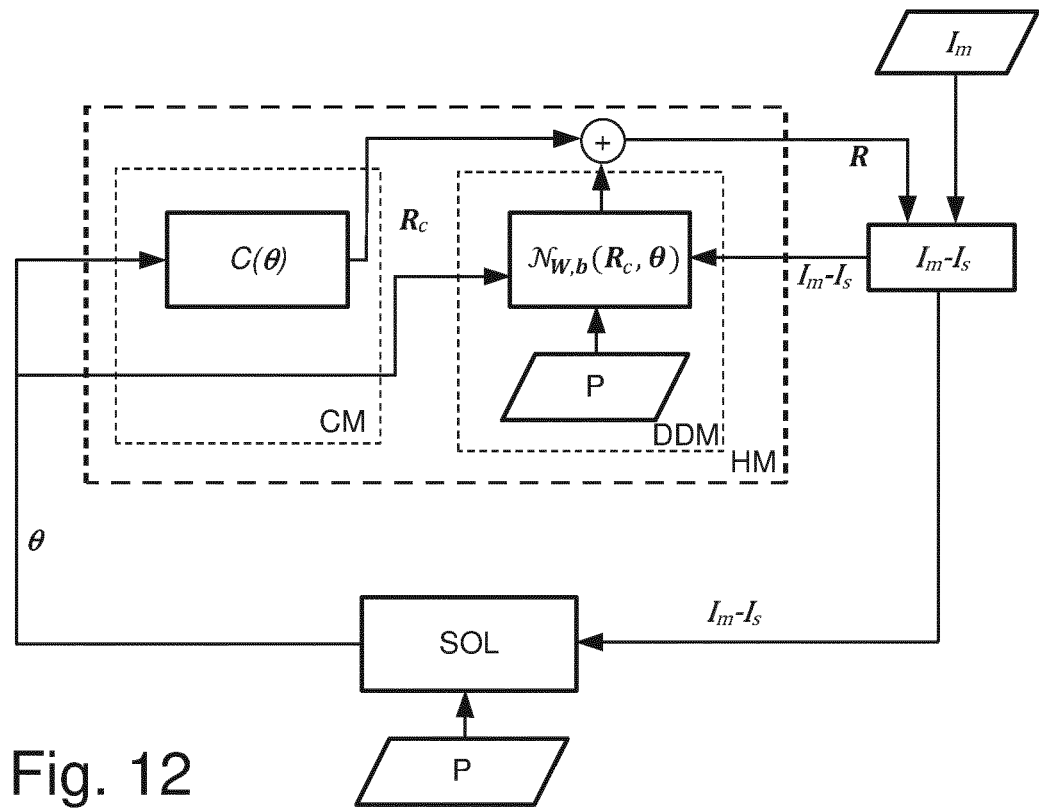
FIG. 12 is a flow diagram describing the training of an alternative hybrid model according to an embodiment of the invention.

Iterate for $t$ =                                                        Algorithm 1

$$1 \ldots \theta_{e_i} = \arg\min_{\theta_{e_i}} \left\|I_{m_i} - I_s\right\|_2^2 + f(\theta_{e_i}) \text{ where } I_s =$$

$$\mathcal{J}(\mathcal{N}_{W,b}(\cdot)) \text{ for some } i \ [W, b] =$$

$$\arg\min_{W,b} \left\| I_{m_i} - \mathcal{J}(\mathcal{N}_{W,b}(C(\theta_{e_i}))) \right\|_2^2 + g(W, b, R, R_c)$$

end where (•) denotes the arguments of the function, in principle they can be C($\theta_{e_i}$) or C($\theta_{e_i}$), $\theta_{e_i}$ depending on the modeling choice (hybrid model HM in FIGS. 10 and 12). They should be consistent between the two equations.

Figure 11:
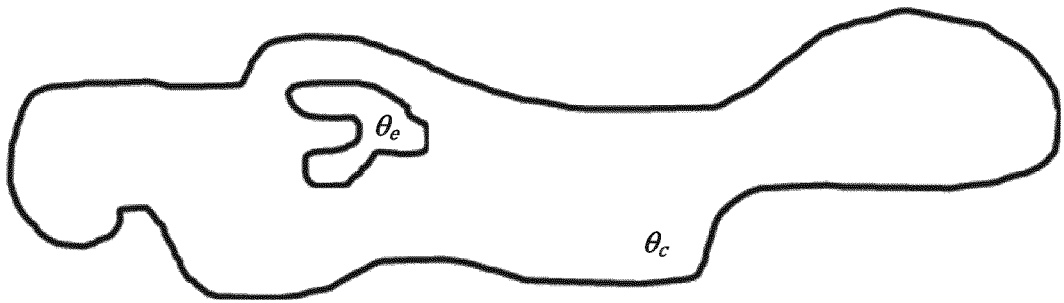
FIG. 11 is an abstract visualization of the parameter space defined by the coarse and data driven models of the hybrid model of FIG. 10.

Generally, to produce a robust recipe, there should be extrapolation outside of the training data. This ensures that the time between required recipe updates is maximized. In the proposed hybrid approach, the coarse model can be thought to represent an extended coarse manifold $\theta_c$ of parameter values in which the signal/model resides. The observed measurements only quantify a subset $\theta_e$ of this coarse parameter space, as the amount of variation on the wafers is confined to a given process window (i.e., the process window defines the subset $\theta_e$). A visual representation is depicted in FIG. 11. It should be appreciated that the training of the data driven model will only be guaranteed to be accurate within the small region where $\theta_e$ resides.

To ensure generalization capabilities, additional constraints can be imposed over the whole coarse manifold $\theta_c$. Such a constraint may be that $R_c + \delta \approx R$ for any given small difference $\delta$. Imposing a bound on the allowed $\delta$ ensures that the corrected reflectivities R do not diverge outside the seen process window. In this case the data driven model correction will generalize, if possible; i.e., if there exists a correction function for the process window that remains common outside of the process window. In the worst case, when the corrections outside of the seen process window are incorrect, the model will only marginally degrade from the coarse model. The additional constraint on $\delta$ is imposed over the whole coarse manifold to ensure consistency.

It is mentioned above that external data, such as CD-SEM data or other estimates for some of the parameter values $\hat{\theta}_{e_i}^P$, can be used as prior information P to guide the solution towards an adequate estimate $\theta_{e_i}$. For example, if CD parameter data is available, i.e., $\theta_{e_i}^{CD}$ is known, this could be added (e.g., in the first step of algorithm 1) in the term $f(\theta_{e_i}) = \beta \|\theta_{e_i}^{CD} - \theta_{e_i}\|_2^2$.

Additionally, multiple priors P can be added to couple estimated parameters on, for example, a wafer level and/or lot level. They can be either linked to the data (e.g., where measurement data for some parameters is available) or may be physically motivated, i.e., imposing that height across a wafer cannot vary with a high frequency, so as to change drastically between adjacent targets, or to impose an assumption that material properties for all targets of a wafer will be the same.

If a neural network model is used for generate the library for the coarse model, transfer learning techniques can be applied to augment the same library to construct the data driven model.

The procedure described above assumes that the calibration model J(R) is correct, or at least is more accurate than the target model. If this not the case, the hybrid model will learn the calibration systematics and try to correct for these also. The resulting accurate model will not be machine independent, and the accuracy will degrade for other machines which require different calibration. Having measurements from multiple machines during the training can improve the matching. Currently, the Jones model is used and the calibration accuracy may result in errors. In particular, for a small spot/target, there are significant calibration and model errors. In this case, the proposed approach builds an improved model which accounts for the calibration systematics.

FIG. 12 shows a variation on the hybrid model flow illustrated in FIG. 10. In the example of FIG. 10, the data driven model DDM outputs corrected/more accurate reflectivities R from inputted coarse reflectivities $R_c$. By contrast, in this variation the data driven model DDM outputs an additive (or otherwise combined) correction for the coarse reflectivities $R_c$ based on the parameterization estimate $\theta_e$.

Once trained, the hybrid model can be used to infer the parameterization of a measured target/structure in place of a more conventional model; i.e., to generate simulated intensities and minimize the difference between the simulated intensities and measured intensities to infer the structure parameterization.

Therefore, this section discloses the coupling of an EM stack model (and it simplification so as to require less sensitive data) with data driven techniques. The use of priors (data priors or physically motivated priors) is described to help learn both the model and the underlying stack parametrization. Limited sensitive information is required, inaccurate geometries may be tolerated if the stack response is not sensitive to them and no material properties are required. An accurate model is learned from the data, building upon the coarse model and, optionally, other tool measurements (CD-SEM data, set values). If calibration is poor, the data driven model can also correct the calibration, at the expense of becoming machine specific. The model can run in a shadow mode to track calibration changes. The model can be used to model interference effects for small target measurements.

The concepts above (recipe creation and hybrid model) can be combined. As such, the recipe creation method can be used to create a recipe for use as a starting point in a reconstruction performed using a hybrid model constructed as disclosed above. To generate the target parametrization $\theta_{e_i}$ for multiple targets, the hierarchical approach can be used.

Combined In-Device and Out-of-Device Inference

For model based inference (including model based inference using a hierarchal solver as disclosed herein) and/or hybrid inference as disclosed herein, current methods involve the creation of a profile based on user stack information and/or third party measurements (e.g. CD-SEM data). In particular, to reconstruct the material properties, special Design of Experiment (DoE) wafers are required, which are obtained from the user (i.e., IC manufacturer).

Generally, the user is reluctant to provide extensive information regarding their fabrication process and, as a result, the available stack description details are limited and most often do not include a proper material characterization. Additionally, the generation of DoE wafers for inference of material properties is expensive, while the resulting wafers have no production value. If no DoE wafers are used, the optical material properties can have a large uncertainty and might not necessary match with those derived from third party, experimental, measurements. Additionally, for some materials, the optical properties are a function of the processing applied to the wafer and a default, third party measurement will not be accurate or else unavailable. Thus, the profile information will be inaccurate resulting in wide ranges for the parametrization. This is especially troublesome with respect to the material parameters since their influence on the stack response is large.

Since many present metrology sensors can only measure low order diffraction, the information content within each measurement is insufficiently rich to infer a large number of parameters (i.e., to do full profile metrology). Also of interest is the possibility to measure in-device structures, which are designed for best performance of the final product, rather than for optimal measurability.

As such, there is no way to control signal strength and correlation with respect to optical metrology measurements. Generally, the geometrical and material parameters, for a given feature, are observed by the sensor as their combined equivalent electrical volume, which introduces a significant correlation between responses with respect to individual parameter variations. This significantly decreases the signal distinguishability.

In this section, a combined inference of in-device and out-of-device structures is proposed. Such a proposal may use a hybrid or hierarchical framework based inference as has been disclosed herein, or a combination of the two. Additionally the use of libraries as has been described in the Hybrid inference system section may also be exploited in such an embodiment. It is further proposed, in an embodiment, to model and solve for parameter values from a significant number of such in-device and out-of-device targets.

In particular, it is proposed to perform a combined inference from measurement of one or more specially designed, out-of-device targets with one or more measurements of in-device structures (e.g., in-device specifically-designed metrology targets and/or actual product structures). The out-of-device-targets may, for example, comprise scribe lane targets. The scribe-lane targets may be optimized for measurability (either generally, or in terms of one or more specific parameters or class of parameters, where a class of parameters may include material property parameters for example). Different scribe lane targets may be optimized for different parameters/classes of parameters. Such a proposal enables a more efficient exploitation of the physical correlation which exists across the wafer (e.g., the material optical parameters which tend to be stable across the wafer; heights or CD parameters which may vary smoothly across the wafer).

Within the scribe line, a specialized target needs only to follow printability rules. As such, for example, the scribe lane targets can be designed to provide a signal boost. In this way, it becomes possible to infer additional parameters, in particular material properties, by coupling out-of-device, high signal targets with in-device measurements. Therefore, if some parameters of interest are common between in-device and out-of-device targets, a joint inference from both of these classes of target will enrich the signal space, enabling a more accurate measurement. It can be appreciated that material properties are a good example of such common parameters.

Figures 13, 14:
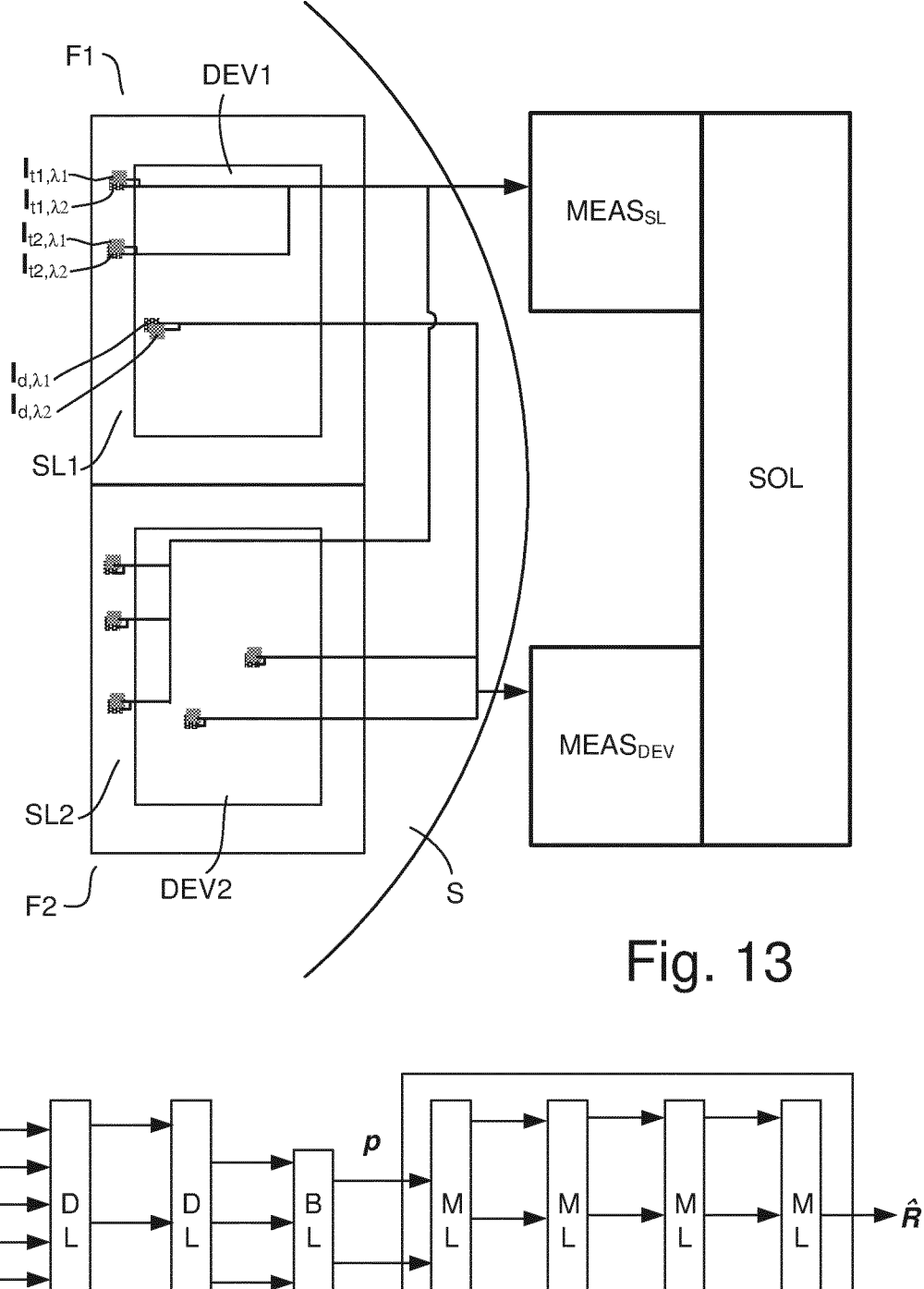
FIG. 13 is a schematic diagram of a method where parameter inference is based on measurements of in-product and out-of-product targets.
FIG. 14 is a schematic diagram of a first example of a decorrelation library for metrology inference.

FIG. 13 schematically illustrates this principle. It shows part of a substrate S comprising two fields F1, F2 each having a device region DEV1, DEV2 and a scribe lane region SL1, SL2 (scribe lanes may, of course, be shared between adjacent fields). Measurement data may comprise in-device measurements represented by $I_{d,\lambda}$ and out-of-device (or scribe lane target) measurements $I_{t_i,\lambda}$, from X fields (F1-Fx, with two fields F1, F2 shown), and at m acquisition settings or wavelengths $\lambda$ (two wavelengths are shown $\lambda 1$, $\lambda 2$). Different acquisition settings may include different polarization settings, wafer rotations, phase retarder rotations in addition to wavelength (varied separately or in different combinations). Various different combinations of in-device and out-of-device measurements per field are possible in a manner similar to the hierarchal solver approach described. As such, the locations and/or types of structures measured may be varied for different fields. Wavelengths/acquisition settings may also be varied between targets and/or fields.

The in-device measurements $MEAS_{DEV}$, comprising measurement data $I_{d,\lambda}$ and out-of-device (scribe lane) measurements $MEAS_{SL}$ comprising measurement data $I_{t_i,\lambda}$ are used by the solver SOL to perform a multi model hybrid/model based optimization.

In an embodiment, it is assumed that an in-device model/hybrid model is parametrized in $\theta_{d,\lambda}$ for the m wavelengths/acquisition settings indexed by $\lambda$. It can be assumed, for example, that the geometrical parameters are common across wavelengths while the material properties are wavelength dependent. Here it is proposed to use an additional collection of n targets (e.g., the out-of-device or scribe lane targets), with models parametrized by $\phi_{t_i,\lambda}$, $\forall i \in [1, n]$, to increase the signal distinguishability between properties that are shared/similar between these scribe lane targets and the in-device structure(s).

Formally, this can be stated, for example, as the optimization task of Equation 5, where the first term is an in-device data fidelity term (m wavelengths), the second term is an out-of-device data fidelity term (m wavelengths, n targets) and the third term is a regularization cost term. Here $\theta_c$ denotes the common part of the parameterization and $f(\cdot)$ denotes a generic function that encodes additional priors/regularization, e.g., in a manner similar to Equation 2 above. It may be noted that, depending on design and structures, it is not necessary for all targets to share the same common properties, e.g., the scribe lane targets may be designed to share similar geometrical properties between themselves, which are not shared with the in-device structure, while the overall material properties may be shared across the full wafer.

$$\underset{\theta_c,\theta_{d,\lambda},\theta_{t_i}}{\operatorname{argmin}} \sum_{\lambda=1}^{m} \|I_{d,\lambda} - I(\theta_{d,\lambda}, \theta_c)\|_2^2 + \qquad \text{(Equation 5)}$$

$$\sum_{i=1,\lambda=1}^{n,m} \|I_{t_i,\lambda} - I(\phi_{t_i,\lambda}, \theta_c)\|_2^2 + f(\theta_{d,\lambda}, \phi_{t_i,\lambda}, \theta_c)$$

The cost function of Equation 5 allows for a similar solution as the hybrid/hierarchical model based inference schemes. Additionally, combining multiple in-device targets is also supported (as illustrated in Field F2 of FIG. 13).

In this manner, a multi-model metrology inference scheme is described, which couples in-device measurements and out-of-device measurements while enabling the out-of-device targets to be designed to optimize signal strength and distinguishability with respect to common parameters (i.e., parameters shared between in-device and out-of-device structure(s)). This obviates the need for experimental wafers which are expensive and time consuming to fabricate, and also allows for the use of custom target design(s) which can optimize measurability for parameters that are insensitive and/or highly correlating with in-device structures, e.g., material properties.

In a further embodiment a low complexity machine learning model that links the material properties (refraction and extinction coefficients) across wavelengths may be added to in-device and out-of-device inference as described in this paragraph, but it may also work standalone within a hybrid inference system or with an inverse problem inference scheme (e.g. RCWA). Such a low complexity machine learning model may be considered if process dependent materials, such as amorphous carbon or amorphous silicon, are present in or on the substrate, either in-device or out-of-device. Process dependent materials have optical properties that may change during wafer processing and need to be characterized under the same conditions. Using a low complexity machine learning model that links the material properties across wavelengths may reduce the need for experimental wafers and/or customer information.

The low complexity machine learning model may be defined as to link parametrization $p_{\lambda_i}^k$ across all wavelengths $\lambda$ by denoting a parameter k to be modeled as $p_{\lambda_i}^k$ at each acquisition wavelength $\lambda_i$. The model may be composed of a sigmoid like activation function $\sigma_{\lambda_i}$, which is a generalized logistic function, applied on a cross wavelength low complexity model $\mathcal{L}_{\theta_k}(\lambda_i)$, e.g. a small neural network with the wavelength as an input and a polynomial with respect to the wavelength as one output. This produces a model for the material parameter $p_{\lambda_i}^k = \sigma_{\lambda_i}(\mathcal{L}_{\theta_k}(\lambda_i))$. During the recipe creation the parametrization of the model $\theta_k$ is decided by fitting to the data via an inverse problem, e.g. as performed in the in-device and out-of-device inference. The shape of the sigmoid $\sigma$ may be wavelength dependent as well as parameter k dependent.

Preferably, the generalized logistic function may be defined to be linear for a broad range of physical values of p and to saturate fast towards an asymptotic value $c_m$ and $c_M$ as p approaches regions that are not considered physical. The extension of the linear regime over a longer range is preferred to be done to tune or decrease the impact of saturation at the asymptotes.

Figure 20:
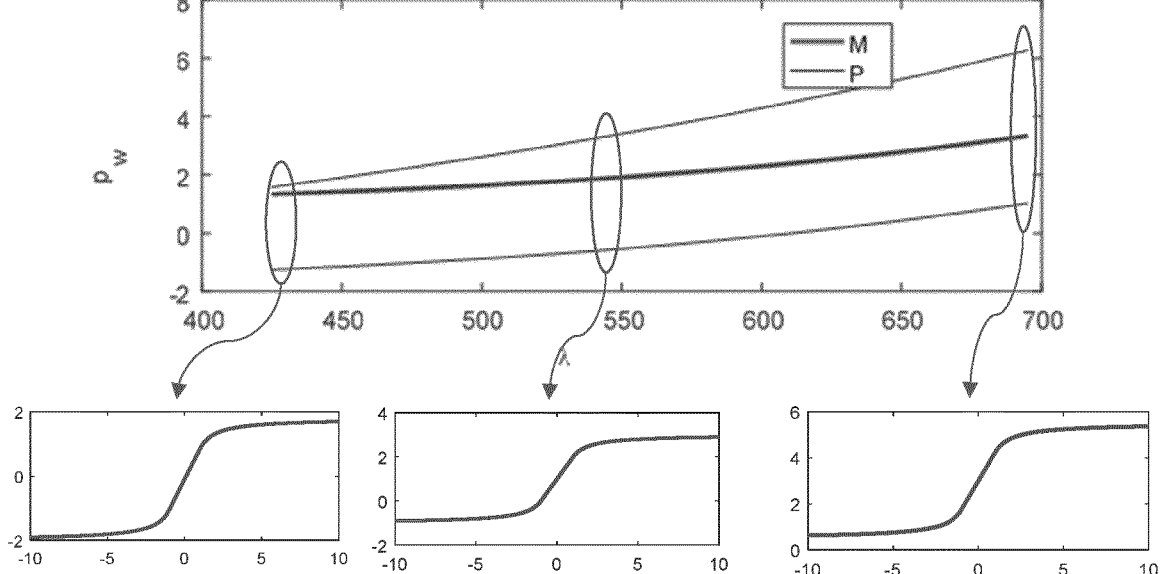
FIG. 20 is a schematic graph of a polynomial model and the associated sigmoids of the material properties as a function of wavelength according to an embodiment of the invention.

The function is advantageously designed to be continuous. Continuity is advantageous because a discontinuous function can potentially create problems for the learning of the model. It may be scaled such that it covers the appropriate physical range. Such a range may be wavelength dependent in which case the scaling differs per wavelength as depicted in FIG. 20. In FIG. 20 a polynomial model of the material properties M and the physical range P and the associated sigmoids are plotted as a function of the wavelength $\lambda$.

A library may constructed that samples the material properties $p^k$ within an assumed physical range and the varying geometrical parameters $g^k$. The meta functions $\sigma_{\lambda_i}(\mathcal{L}_{\theta_k}(\lambda_i))$ are then applied to create a wavelength varying dependent parameterized fit during the inverse problem inference. The new inference problem is based on the geometrical parameters and on the parametrization $\theta_k$ of the imposed material models.

Non-Linear Parameter Decorrelation

As has already been mentioned, the data driven, hybrid and model-based solutions are all negatively impacted by correlation between the parameters of interest, e.g., due to the physical coupling of the parameters. The bulk of the intensity signal is mainly carrying information describing the electrical volume of the different features of the stack, and not a specific height, CD or sidewall angle. For data driven solutions, this can limit the effective signal distinguishability e.g., if the same experimental response can be generated by changing a height, CD or combination of both, the solution becomes ill posed and the generation of experimental data is difficult. This places a fundamental limit on the sensor capabilities. For the hybrid and model based solutions, such correlation introduces instability in the solution because the condition number of the problem becomes large. This slows down convergence and can even trigger erratic behavior. Part of this correlation is due to the fundamental limit of the sensor capabilities. However, since the full/coarse model of the stack can only be expressed in terms of a geometrical description and not in terms of electrical volume of the various features, additional correlation is introduced by poor parametrization of the hybrid/full model.

In this section, a method is proposed for alleviating the correlation induced issues for hybrid and model based solutions which arise from the mis-parametrization of the model. The proposal uses a surrogate model to create a re-parameterization of the stack towards a minimum sufficient statistic representation. Additionally, the surrogate model may be used to speed up the solutions by providing an approximation for the electromagnetic simulations via a library (the library may be as disclosed in the Hybrid inference system section).

In most current use cases the stack to be measured is very complex and a full profile metrology to infer all parameters $\theta$, is neither practical or necessary; only the estimation of one or more specific stack parameters of interest is required. It is therefore proposed to use a data driven machine learning re-parameterization of the stack, which attempts to construct a minimum sufficient statistic for the combination of all parameters, while ensuring that the parameters of interest are maintained to be distinguishable within the minimum sufficient statistic.

In an embodiment, it is proposed to use a neural network to model the stack reflectivity response R up to a given accuracy level, while also learning a mapping to a lower dimensional space which removes any redundancy (which implies correlation) in the parametrization. The main feature is the introduction of a bottleneck in the architecture which limits the information flow such that a mapping to a lower dimensional subspace is learned. Note that a similar use of bottleneck constructs are found in a very different context for the construction of auto-encoders. The training of the library is standard and implies the minimization of a mean squared error cost, e.g. $\min\|R-\hat{R}\|_2^2$, where $\widehat{(\cdot)}$ denotes estimated/approximated values. This can be achieved by employing stochastic solvers to train a mapping from $\theta$ to R.

FIG. 14 is a schematic illustration of this concept according to a first example, and shows a decorrelation library or decorrelation network comprising a plurality of layers including one or more decorrelation layers DL, one or more bottleneck layers BL and one or more modeling layers ML. The input parameters $\theta$ are mapped to a lower dimensional non-linear subspace parameterized by p, where p represents the re-parameterization to a lower dimension or restricted parameter space. Note that the restricted parameter space p is not merely a proper subset of the input parametrization $\theta$ comprising some of the same parameters, but rather a completely new, and smaller parameterization in terms of completely different parameters. The mapping is achieved via at least one decorrelation layer DL and a bottleneck layer BL, where the layers may comprise layers of a neural network or similar artificial intelligence network. The height of the layers in the schematic diagram is indicative of the number of neurons (nodes) in that layer; i.e., the bottleneck layer BL has fewer neurons than the decorrelation layers DL. In the example shown here, there are two decorrelation layers DL, although this is purely exemplary and the number of decorrelation layers DL (and bottleneck layers BL) can be varied from that shown.

A reflectivity modeling library RML or reflectivity model comprising one or more modeling layers ML (e.g., reparametrized stack model layers or reparametrized library layers) are then used to learn how to model the modelled reflectivities $\hat{R}$ from the restricted parameter space p. Once again, the layers may comprise layers of a neural network or similar artificial intelligence network. In the example shown here, there are four modeling layers ML, although this is purely exemplary and the number of modeling layers ML can be varied from that shown.

The size of the bottleneck layer BL (i.e., number of neurons) determines the information content which is available for the modeling layers ML. The training error and implicit accuracy with respect to the modeled reflectivities can be determined and assessed for several sizes of the bottleneck layer BL. The size of the bottleneck layer BL affects the predictability of the modelled reflectivities. It can be shown that the size of the bottleneck is problem dependent and generally can vary from one up to up to an upper limit $n_p$. The rationale behind this is that if the original parametrization $\theta$ was maintained, i.e. $p=\theta$, then the mapping would be completely accurate (one-to-one). If there is no correlation in the response with respect to the parametrization $\theta$ than it is only possible to have a smaller restricted parametrization p if some information is lost. Where there is correlation then there should exist a restricted parametrization p which can model the same response with a smaller size.

As has been described in a previous section, a current way of working comprises mapping $\theta$ to R and using an optics model to map reflectivities R to intensities I (e.g. using the Jones model), to solve Equation 1. Such an approach does not remove the correlation that can exist between various parameters.

In this method, it is proposed to solve the problem in the equivalent lower dimensional space parametrized by p; e.g., by solving:

$$\arg\min_{\theta} \| I_m - I(p) \|_2^2 + g(p), \qquad \text{Equation (6)}$$

where g similarly represents a prior information term.

In what follows, several embodiments of the main concept illustrated in FIG. 14 will be described. It will be noted that in general two or more of these embodiment can be combined into more complicated structures. As with the previous example, the number of layers (whichever type of layer) is purely exemplary and may be varied.

Figure 15:
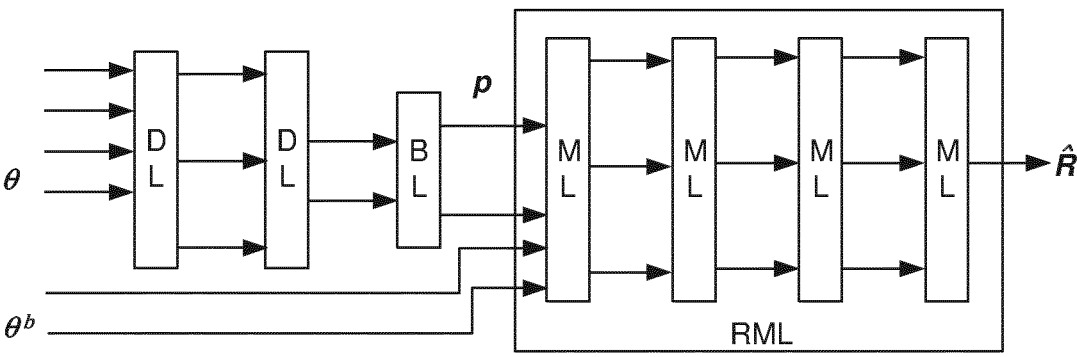
FIG. 15 is a schematic diagram of a second example of a decorrelation library for metrology inference, comprising a parameter bypass.

FIG. 15 illustrates a variation of the arrangement of FIG. 14, incorporating a bottleneck bypass for bypassing one or more bypassed parameters $\theta^b$ (where the bypassed parameters $\theta^b$ comprise a subset of the full stack parametrization). It is usual for one or more of the stack response parameters to be known with a high degree of confidence (e.g. wavelength and/or angle of incidence of the illumination). In such cases, the bypassed parameters $\theta^b$ may comprise these known parameters, and can be considered fixed during reconstruction/parameter inference, e.g., to a value decided at the time of the measurement. However, the known parameters should still be used for the training of the reflectivity model library RML since the actual value is decided during the measurement (e.g. to obtain a cross-wavelength model/library). As such, it is proposed that these known parameters are forwarded as bypass parameters $\theta^b$ such that they bypass the bottleneck layer BL (and decorrelation layers DL) and are used directly as an input when building the reflectivity model library RML.

Another reason for bypassing a parameter around the bottleneck layer is that if it belongs to the class of "parameters of interest" for the given stack (e.g., if it is a parameter being measured such that a value for the parameter is actively sought). For example if CD is a parameter of interest, it is proposed that the CD parameter is not re-parameterized through the bottleneck layer. Instead, one or more of these parameters of interest can be forwarded as bypass parameters $\theta^b$, e.g., as a free standing parameter outside of the bottleneck layer BL. In this case, the bypassed parameter will be a parameter to be optimized. As such, the bypass parameters $\theta^b$ may comprise one or more such parameters of interest, either as an alternative, or in addition to, known parameters.

Figure 16:
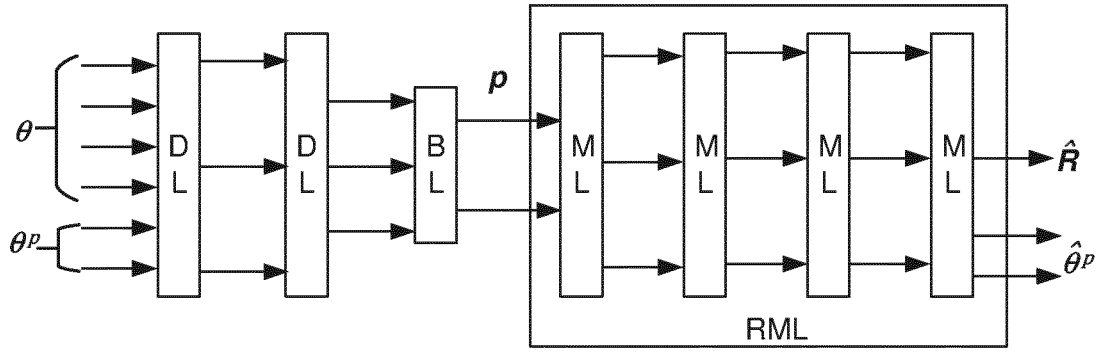
FIG. 16 is a schematic diagram of a third example of a decorrelation library for metrology inference, comprising direct inference of one or more parameters.
Figure 17:
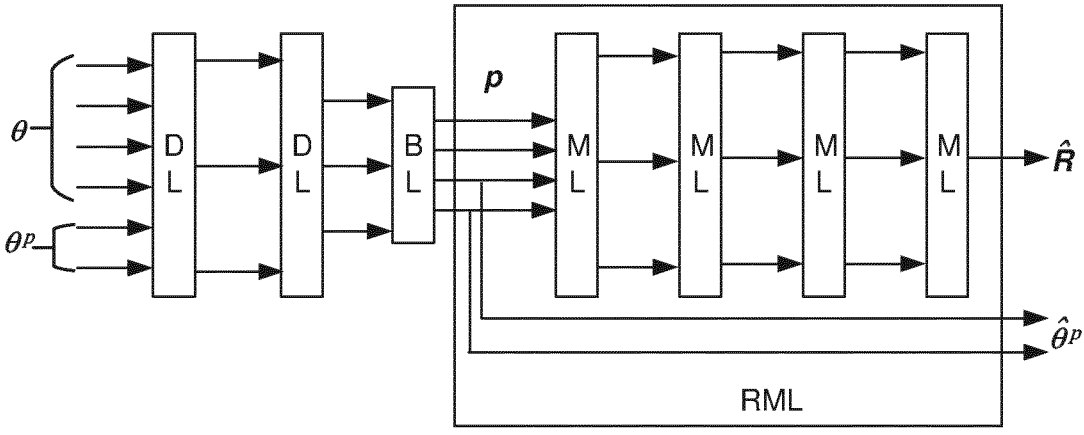
FIG. 17 is a schematic diagram of a fourth example of a decorrelation library for metrology inference, comprising another example of direct inference of one or more parameters.

FIGS. 16 and 17 illustrate examples of another embodiment where the decorrelation library directly provides a forward parameter prediction $\hat{\theta}^p$ (e.g., for particular parameters of interest $\theta^p$) in addition to the modelled reflectivities $\hat{R}$. For such parameters of interest $\theta^p$, one way to ensure a workable inference is to train a library or model to infer these parameters directly. This enables the passing of such parameters $\theta^p$ through the bottleneck layer BL. In this way, the model can maximally decorrelate these parameters from the remaining stack parameters $\theta$. Such approach, for example, can be an alternative to the bottleneck bypass. The requirement that the parameters are matched at the output ensures that there can be a mapping from the restricted parameter space p to the actual parameters of interest $\theta^p$, as is illustrated in FIG. 16. Here, the parameters of interest are inferred by direct prediction. FIG. 17 illustrates a method where the restricted parameterization p allows the parameters of interest to be inferred via solving of an inverse problem rather than via the modeling layers ML.

Figure 18:
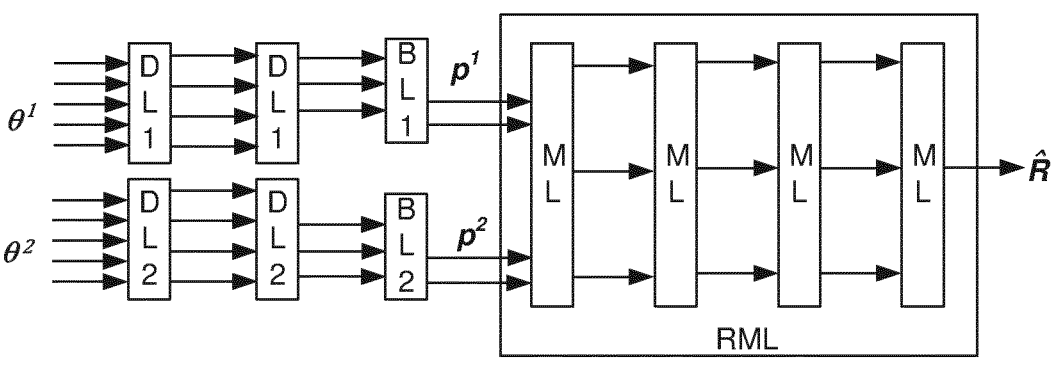
FIG. 18 is a schematic diagram of a fifth example of a decorrelation library for metrology inference, comprising parallel bottleneck layers for different classes of parameters.

FIG. 18 shows an arrangement comprising multiple (parallel) parameter bottleneck layers BL1, BL2. When solving the inverse problem, multiple priors are generally placed on the solution (examples of this are described in the hierarchical prior and hybrid inference embodiments described above). In some cases it can be useful to group specific parameters (e.g., according to specific classes of parameters $\theta^1$, $\theta^2$) and to create multiple stand-alone bottleneck layers to allow the introduction of stronger priors (e.g., being applicable to/optimized for respective classes). An example of two specific classes of parameters may comprise geometrical parameters and material parameters (more than two classes is possible, with a corresponding number of parallel decorrelation layers and bottleneck layers). In the specific example here, there are two parallel paths (neural networks) for each class of parameters $\theta^1$, $\theta^2$, each path comprising decorrelation layers DL1, DL2 and one a bottleneck layer BL1, BL2. In this manner, different respective priors can be placed on the two classes of parameters $\theta^1$, $\theta^2$ and the two bottlenecks BL1, BL2 ensure that the parametrization of the two classes (e.g., geometry vs. material) remains separable.

Figure 19:
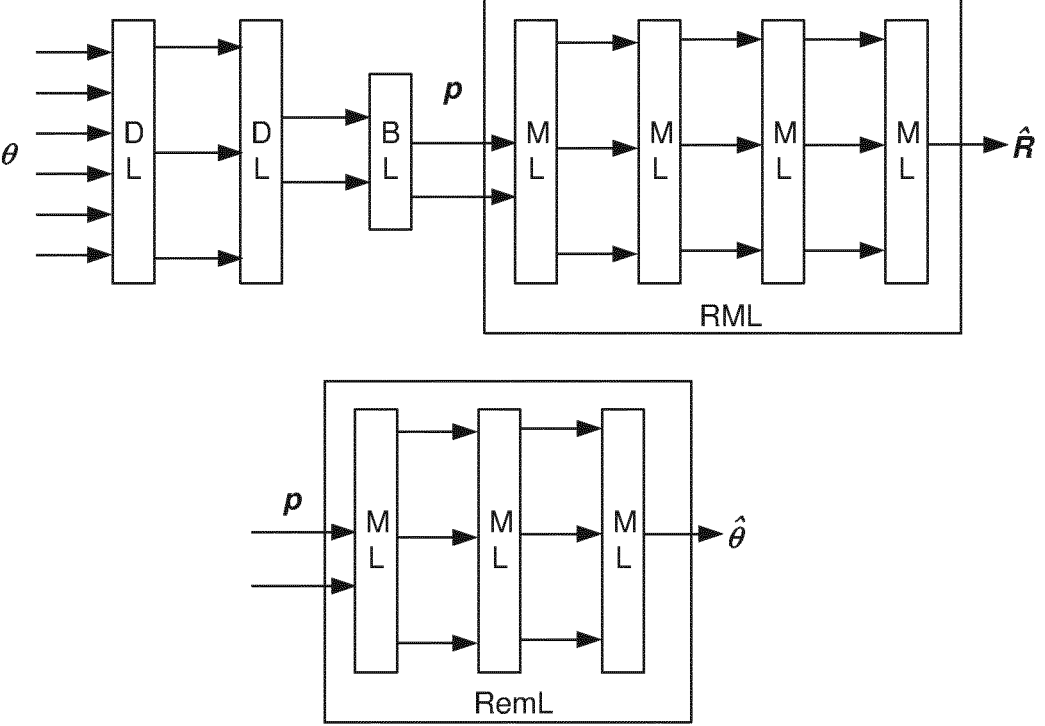
FIG. 19 is a schematic diagram of a sixth example of a decorrelation library for metrology inference, comprising a remapping library.

FIG. 19 shows a method where a parameter distinguishability metric is determined using a decorrelating library or model. A decorrelating library (e.g., remapping library) can be used to infer correlation between a parameter and another parameter or group of other parameters, e.g., to infer a correlation metric between the parameters that define a volume. As such, the correlation metric may describe the degree of correlation between any two parameters. This can be achieved by attempting to invert/re-map the low dimensional mapping which the bottleneck layer induces. Such a task is generally ill-posed and the accuracy of the recovery can be seen as an indicator of the correlation. Therefore, after training a similar arrangement as illustrated in FIG. 14, thereby creating a decorrelation library, an additional component or remapping library RemL can be trained, which attempts to invert that mapping. It should be noted, that while FIG. 19 shows an arrangement based on the decorrelation structure of FIG. 14, any of the previously described decorrelation structures can be used, e.g., any of those illustrated in FIGS. 14 to 18 in this embodiment.

The training may be such that the remapping library RemL is trained to find the approximate solution $\hat{\theta}$ with p being generated by the already trained decorrelation library. The ability to recover individual parameters $\hat{\theta}_i$ from the re-parametrization p is a direct indication of the correlation level between $\hat{\theta}_i$ and the remaining parameters $\hat{\theta}_j$, $\forall j \neq i$. The correlation level (correlation metric) can be inferred by varying the bottleneck size and assessing the resultant error in predicting the reflectivities, together with the error of the parametrization re-mapping.

By way of a specific example, consider a case where the aim is to quantify the correlation of the response with respect to the three parameters defining a grating volume, e.g., height, width and sidewall angle. This can be applied for any stack, with all other parameters by-passing the bottleneck layer BL. In such case, two libraries can be trained, each with a respective bottleneck layer. The error level for the two libraries, e.g., as determined by R–R̂, provides a metric of the modeling ability for the stack with each of the bottleneck layers. The error level, θ–θ̂, of the re-mapping library defines the distinguishability level for each of the parameters, if the fit to the data reaches the library accuracy.

This section therefore, describes an automated decorrelation/reparameterization technique which speeds up the inference by reducing the condition number and lowering the number of effective parameters. This removes the need for expert user design of parameterizations to produce a stable/consistent model behavior and introduces a systematic way to analyze the information carried by the stack response. Such an approach can be used to improve the robustness of the hybrid/model (including any which use a hierarchal prior) based inference and to increase convergence speed for the inverse problem solvers. A correlation metric between different parameters can be defined by linking the achievable reflectivity accuracy with the size of the bottleneck layer.

The targets and target structures in any of the embodiments described above may be metrology target structures specifically designed and formed for the purposes of measurement, or target structures which are functional parts of devices formed on the substrate. The term target should not limit to any specific structure or type of structure, but instead encompasses any measured structure.

In association with the physical grating structures of the target structures as realized on substrates and patterning devices, an embodiment may include a computer program containing one or more sequences of machine-readable instructions describing methods of measuring target structures on a substrate and/or analyzing measurements to obtain information about a lithographic process. This computer program may be executed for example within unit PU in the apparatus of FIG. 3 or FIG. 4 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3 or FIG. 4, is already in production and/or in use, the invention can be implemented by the provision of updated computer program products for causing a processor to perform the methods as described above and as claimed.

Further embodiments according to the present invention are described in below numbered clauses:

1. A method of determining a reconstruction recipe describing at least nominal values for using in a reconstruction of a parameterization describing a target; comprising:
   obtaining first measurement data relating to measurements of a plurality of targets on at least one substrate, said measurement data relating to one or more acquisition settings;
   performing an optimization by minimizing a cost function to minimize differences between the first measurement data and simulated measurement data based on a reconstructed parameterization for each of said plurality of targets;
   wherein a constraint on the cost function is imposed based on a hierarchical prior.
2. A method according to clause 1, wherein the hierarchical prior encodes prior information regarding the scale of the parameters.
3. A method according to clause 1 or 2, wherein the hierarchical prior imposes a constraint on differences in parameter values in said reconstructed parameterization from corresponding experimentally measured parameter values obtained from a tool of reference.
4. A method according to clause 3, wherein said constraint on differences in parameter values in said reconstructed parameterization from corresponding experimentally obtained parameter values allows for an inexact match to take into account statistical errors which affect the first measurement data.
5. A method according to any 3 or 4, wherein the method further outputs tool matching data describing a relationship between the first measurement data with respect to corresponding experimentally obtained measurement data from the tool of reference.
6. A method according to any preceding clause, wherein a first regularization is imposed on said hierarchical prior.
7. A method according to clause 6, wherein the first regularization determines a fix-float strategy by preferring solutions with the minimum number of parameters varied.
8. A method according to clause 6 or 7, wherein the first regularization is an L1 norm regularization.
9. A method according to clause 6, 7 or 8, comprising minimizing the cost function for different strengths of the first regularization.
10. A method according to any preceding clause, comprising matching statistical properties of the solution of the cost function to those of a solution of a single target reconstruction, wherein the strength of a second regularization imposed on the single target reconstruction is determined iteratively.
11. A method according to clause 10, wherein said determining the strength of the second regularization comprises minimizing a divergence between a parameter distribution of the solution of the cost function and a parameter distribution of the solution of the single target reconstruction over multiple targets.
12. A method according to clause 10 or 11, wherein one or more performance indicators describing performance of the parameter values from the matched single target reconstruction are evaluated, and the reconstruction recipe corresponding to the best performance indicators chosen as said determined reconstruction recipe.
13. A method according to any preceding clause, wherein the hierarchical prior imposes a constraint in favor of a region of interest describing a valid physical parametrization.
14. A method according to any preceding clause, wherein the hierarchical prior imposes a consistency constraint in favor of consistency for highly correlated parameters over multiple targets.
15. A method according to clause 14, wherein the consistency constraint relates at least to material property parameters, where it can be assumed that the material properties will not vary significantly between targets.
16. A method according to any preceding clause, wherein the cost function comprises at least one data fidelity term which is solved for said plurality of targets.
17. A method according to clause 16, wherein the data fidelity term is solved for each of said plurality of targets, for a plurality of acquisition settings.
18. A method according to clause 16 or 17, wherein the at least one data fidelity term comprises a first data fidelity term solved for a first subset of said plurality of targets, said first subset being located within a product area of the substrate and second data fidelity term solved for a second subset of said plurality of targets, said second subset being located outside of the device area of the substrate.

19. A method according to clause 18, wherein the second subset of said plurality of targets are located within a scribe lane area of the substrate.

20. A method according to clause 18 or 19, wherein the second subset of said plurality of targets are designed and/or optimized for measurability, generally and/or in terms of one or more parameters.

21. A method according to clause 18, 19 or 20 wherein the first subset of said plurality of targets comprise one or more product structures.

22. A method according to any of clauses 18 to 21, wherein said first data fidelity term is parameterized in terms of first parameters relating to said first subset of said plurality of targets, said second data fidelity term is parameterized in terms of second parameters relating to said second subset of said plurality of targets, and each of said first data fidelity term and said second data fidelity term comprises a separately treated common parameterization relating to both of said first subset and said second subset of said plurality of targets.

23. A method of constructing a hybrid model for providing simulated data for use in parameter reconstruction of a structure, the method comprising:
   obtaining a coarse model operable to provide simulated coarse data; and
   training a data driven model to correct said simulated coarse data so as to determine said simulated data.

24. A method according to clause 23, wherein the simulated coarse data comprises simulated coarse reflectivity data.

25. A method according to clause 23 or 24, wherein the data driven model is operable to determine corrections for combining with said simulated coarse data.

26. A method according to clause 23 or 24, wherein the data driven model is operable to derive said simulated data from said simulated coarse data.

27. A method according to any of clauses 23 to 26, wherein at least the data driven model is a machine learned neural network model.

28. A method according to clause 27, wherein the hybrid model is a machine learned neural network model and comprises a bottleneck layer having fewer nodes than one or more preceding layers.

29. A method according to clause 28, wherein the bottleneck layer and said one or more one or more preceding layers together learn a mapping to a restricted parameter space with respect to an input parameterization.

30. A method according to clause 29, wherein said hybrid model comprises one or more of said preceding layers, said preceding layers comprising decorrelation layers.

31. A method according to clause 29 or 30, wherein said restricted parameter space represents a minimum sufficient statistic for the combination of all parameters of said input parameterization.

32. A method according to clause 29, 20 or 31 wherein said hybrid model comprises one or modeling layers subsequent to said bottleneck layer, which models the simulated data from the restricted parameter space.

33. A method according to clause 32, wherein said one or modeling layers are operable to directly infer one or more parameter values for one or more directly inferred parameters.

34. A method according to clause 33, wherein said one or more directly inferred parameters comprise one or more parameters of interest.

35. A method according to any of clauses 29 to 34, wherein one or more parameters are bypassed said bottleneck layer.

36. A method according to clause 35, wherein said one or more parameters which are bypassed comprise one or more known parameters for which a value is known and/or one or more parameters of interest.

37. A method according to any of clauses 29 to 36, comprising at least two parallel bottleneck layers, each for a respective subset of the input parameterization.

38. A method according to clause 37 wherein each of said parallel bottleneck layers enable the imposition of respective priors to each of said subsets of the input parameterization.

39. A method according to any of clauses 28 to 38, comprising training an additional model which is operable to invert and/or re-map the mapping which the bottleneck layer induces; and
   use said additional model to determine a correlation metric for describing a correlation between a parameter and one or more other parameters.

40. A method according to any of clauses 23 to 39, wherein the training step comprises performing iterations of:
   determining parameter value estimates for the coarse model based on measurement data and said simulated data; and
   updating the data driven model using the determined parameter value estimates such that the measurement data and the simulated data are a better match.

41. A method according to clause 40, wherein the measurement data comprises intensity data relating to a plurality of targets.

42. A method according to clause 41, wherein the plurality of targets comprises a first subset of targets, said first subset being located within a product area of the substrate and a second subset of targets, said second subset being located within outside of the device area of the substrate.

43. A method according to clause 42, wherein the second subset of targets are located within a scribe lane area of the substrate.

44. A method according to clause 42 or 43, wherein the second subset of targets are optimized for measurability, generally and/or in terms of one or more parameters.

45. A method according to clause 42, 43 or 44, wherein the first subset of targets comprise one or more product structures.

46. A method according to any of clauses 42 to 45, wherein said hybrid model is parameterized in terms of first parameters relating to said first subset of targets, in terms of second parameters relating to said second subset of targets, and additionally, a separately treated common parameterization relating to both of said first subset and said second subset of targets.

47. A method according to any of clauses 40 to 46, wherein the measurement data comprises intensity data relating to a plurality of acquisition settings.

48. A method according to any of clauses 40 to 47, wherein prior information describing known parameter values are used to constrain said determination of parameter value estimates.

49. A method according to any of clauses 40 to 48, wherein a regularization is imposed on the step of updating the data driven model based on an assumption that the simulated coarse data and simulated data are not too dissimilar.

50. A method according to any of clauses 23 to 49, comprising using said hybrid model in a parameter reconstruction of a structure in a metrology operation.

51. A method according to clause 50, further comprising an initial step of determining a reconstruction recipe for said parameter reconstruction using the method of any of clauses 1 to 22.

52. A method of metrology comprising:
    obtaining first measurement data relating to measurements of a plurality of targets on at least one substrate, wherein the plurality of targets comprises a first subset of targets, said first subset being located within a product area of the substrate and a second subset of targets, said second subset being located within outside of the device area of the substrate;
    solving a cost function minimizing differences between the first measurement data and simulated measurement data based on a reconstructed parameterization for each of said plurality of targets;
    wherein said cost function is parameterized in terms of first parameters relating to said first subset of targets, in terms of second parameters relating to said second subset of targets, and additionally, a separately treated common parameterization relating to both of said first subset and said second subset of targets.

53. A method of metrology according to clause 52, wherein said measurement data relates to one or more acquisition settings.

54. A method of metrology according to clause 52 or 53, wherein the second subset of targets are located within a scribe lane area of the substrate.

55. A method of metrology according to clause 52, 53 or 54 wherein the second subset of targets are optimized for measurability, generally and/or in terms of one or more parameters.

56. A method of metrology according to any of clauses 52 to 55, wherein the first subset of targets comprise one or more product structures.

57. A method of metrology according to any of clauses 52 to 56, wherein said cost function comprises a first data fidelity term, parameterized in terms of said first parameters, a second data fidelity term parameterized in terms of said second parameters, each of said first data fidelity term and said second data fidelity term comprising said separately treated common parameterization.

58. A method of constructing a decorrelation model for inferring one or more values for one or more parameters describing a structure being measured, the method comprising:
    training said decorrelation model to learn a mapping to a restricted parameter space with respect to an input parameterization;

59. A method according to clause 58, further comprising training the decorrelation model to simulate a response based on said restricted parameter space.

60. A method according to clause 59, wherein the response comprises a reflectivity response.

61. A method according to clause 58, 59 or 60, wherein said decorrelation model comprises a bottleneck layer having few nodes than one or more preceding layers.

62. A method according to clause 61, wherein the bottleneck layer and said one or more one or more preceding layers together learn the mapping to a restricted parameter space with respect to the input parameterization.

63. A method according to clause 62, wherein said preceding layers comprising decorrelation layers.

64. A method according to clause 62 or 63, wherein said decorrelation model comprises one or modeling layers subsequent to said bottleneck layer, which models the simulated data from the restricted parameter space.

65. A method according to clause 64, wherein said one or modeling layers are operable to directly infer one or more parameter values for one or more directly inferred parameters.

66. A method according to clause 65, wherein said one or more directly inferred parameters comprise one or more parameters of interest.

67. A method according to any of clauses 62 to 66, wherein one or more parameters are bypassed said bottleneck layer.

68. A method according to clause 67, wherein said one or more parameters which are bypassed comprise one or more known parameters for which a value is known and/or one or more parameters of interest.

69. A method according to any of clauses 62 to 68, comprising at least two parallel bottleneck layers, each for a respective subset of the input parameterization.

70. A method according to clause 69, wherein each of said parallel bottleneck layers enable the imposition of respective priors to each of said subsets of the input parameterization.

71 A method according to any of clauses 62 to 70, comprising training an additional model which is operable to invert and/or re-map the mapping which the bottleneck layer induces; and
    using said additional model to determine a correlation metric for inferring a correlation between a parameter and one or more other parameters.

72. A method according to any of clauses 58 to 71, wherein said restricted parameter space represents a minimum sufficient statistic for the combination of all parameters of said input parameterization.

73. A method according to any of clauses 58 to 72, comprising using said decorrelation model in a parameter reconstruction of a structure in a metrology operation 74. A metrology apparatus being operable to perform the method of any of clauses 1 to 73.

75. A metrology apparatus according to clause 74 comprising:
    a support for a substrate having a plurality of target structures thereon;
    an optical system for measuring each target structure; and
    a processor arranged to perform said method of any of clauses 1 to 73.

76. A lithographic system comprising:
    a lithographic apparatus comprising:
    an illumination optical system arranged to illuminate a pattern;
    a projection optical system arranged to project an inspection of the pattern onto a substrate; and
    a metrology apparatus according to any clause 74 or 75.

77. A computer program comprising processor readable instructions which, when run on suitable processor controlled apparatus, cause the processor controlled apparatus to perform the method of any one of clauses 1 to 73.

78. A computer program carrier comprising the computer program of clause 77.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of constructing a hybrid model for providing simulated data for use in parameter reconstruction of a structure, the method comprising:
   obtaining a coarse model operable to provide simulated coarse data; and
   training, by a hardware computer, a data driven model so as to determine the simulated data, the data driven model configured to produce a same type of data as the simulated coarse data and the same type of data is a corrected version of the simulated coarse data.

2. The method according to claim 1, wherein the simulated coarse data comprises simulated coarse reflectivity data.

3. The method according to claim 1, wherein the data driven model is configured to determine corrections to combine with the simulated coarse data.

4. The method according to claim 1, wherein the data driven model is configured to derive the simulated data from the simulated coarse data.

5. The method according to claim 1, wherein at least the data driven model is a machine learned neural network model.

6. The method according to claim 1, wherein the hybrid model is a machine learned neural network model and comprises a bottleneck layer having fewer nodes than one or more preceding layers.

7. The method according to claim 6, wherein the bottleneck layer and the one or more one or more preceding layers together learn a mapping to a restricted parameter space with respect to an input parameterization.

8. The method according to claim 7, wherein:
   the hybrid model comprises one or more of the preceding layers, the preceding layers comprising decorrelation layers, or
   the restricted parameter space represents a minimum sufficient statistic for the combination of all parameters of the input parameterization, or
   the hybrid model comprises one or more modeling layers subsequent to the bottleneck layer, which models the simulated data from the restricted parameter space.

9. The method according to claim 6, further comprising training an additional model which is operable to invert and/or re-map a mapping which the bottleneck layer induces; and
   using the additional model to determine a correlation metric for describing a correlation between a parameter and one or more other parameters.

10. The method according to claim 1, wherein the training step comprises performing iterations of:
   determining parameter value estimates for the coarse model based on measurement data and the simulated data; and
   updating the data driven model using the determined parameter value estimates such that the measurement data and the simulated data are a better match.

11. The method according to claim 10, wherein the measurement data comprises intensity data relating to a plurality of targets.

12. The method according to claim 1, further comprising using the hybrid model in a parameter reconstruction of a structure in a metrology operation.

13. A computer program product comprising a non-transitory computer readable medium having instructions therein, the instructions, when executed by a computer system, configured to cause the computer system to at least:
   obtain a coarse model operable to provide simulated coarse data; and
   train a data driven model so as to determine simulated data for use in parameter reconstruction of a structure by a hybrid model, the data driven model configured to produce a same type of data as the simulated coarse data and the same type of data is a corrected version of the simulated coarse data.

14. The computer program product of claim 13, wherein the simulated coarse data comprises simulated coarse reflectivity data.

15. The computer program product of claim 13, wherein the data driven model is configured to determine corrections to combine with the simulated coarse data.

16. The computer program product of claim 13, wherein the data driven model is configured to derive the simulated data from the simulated coarse data.

17. The computer program product of claim 13, wherein at least the data driven model is a machine learned neural network model.

18. The computer program product of claim 17, wherein the hybrid model is a machine learned neural network model and comprises a bottleneck layer having fewer nodes than one or more preceding layers.

19. The computer program product of claim 13, wherein the instructions configured to cause the computer system to train the data driven model are further configured to cause the computer system to perform iterations of:

determination of parameter value estimates for the coarse model based on measurement data and the simulated data; and updates of the data driven model using the determined parameter value estimates such that the measurement data and the simulated data are a better match.

20. The computer program product of claim 13, further configured to cause the computer system to use the hybrid model in a parameter reconstruction of a structure in a metrology operation.

* * * * *